US010916540B2

(12) United States Patent
El-Hinnawy et al.

(10) Patent No.: US 10,916,540 B2
(45) Date of Patent: Feb. 9, 2021

(54) DEVICE INCLUDING PCM RF SWITCH INTEGRATED WITH GROUP III-V SEMICONDUCTORS

(71) Applicant: Newport Fab, LLC, Newport Beach, CA (US)

(72) Inventors: Nabil El-Hinnawy, Irvine, CA (US); David J. Howard, Irvine, CA (US); Gregory P. Slovin, Irvine, CA (US); Jefferson E. Rose, Hawthorne, CA (US)

(73) Assignee: Newport Fab, LLC, Newport Beach, CA (US)

( * ) Notice: Subject to any disclaimer, the term of this patent is extended or adjusted under 35 U.S.C. 154(b) by 179 days.

(21) Appl. No.: 16/173,340

(22) Filed: Oct. 29, 2018

(65) Prior Publication Data

US 2020/0058638 A1 Feb. 20, 2020

Related U.S. Application Data

(63) Continuation-in-part of application No. 16/161,960, filed on Oct. 16, 2018, now Pat. No. 10,644,235, and
(Continued)

(51) Int. Cl.
*H01L 27/06* (2006.01)
*H01L 23/66* (2006.01)
(Continued)

(52) U.S. Cl.
CPC ...... *H01L 27/0605* (2013.01); *H01L 21/8252* (2013.01); *H01L 23/66* (2013.01);
(Continued)

(58) Field of Classification Search
CPC ... H01L 27/0605; H01L 23/66; H01L 45/065; H01L 45/1226; H01L 21/8252;
(Continued)

(56) References Cited

U.S. PATENT DOCUMENTS 5,976,932 A 11/1999 Kerber
6,448,576 B1 9/2002 Davis
(Continued)

FOREIGN PATENT DOCUMENTS

WO WO 2016/028362 2/2016

OTHER PUBLICATIONS

N. El-Hinnawy et al., "12.5 THz Fco GeTe Inline Phase-Change Switch Technology for Reconfigurable RF and Switching Applications," 2014 IEEE Compound Semiconductor Integrated Circuit Symposium (CSICS), La Jolla, CA, 2014, pp. 1-3, doi: 10.1109/CSICS.2014.6978522. (Year: 2014).*
(Continued)

*Primary Examiner* — John P. Dulka
(74) *Attorney, Agent, or Firm* — Farjami & Farjami LLP

(57) ABSTRACT

There are disclosed herein various implementations of a semiconductor device including a group III-V layer situated over a substrate, and a phase-change material (PCM) radio frequency (RF) switch situated over the group III-V layer. The PCM RF switch couples a group III-V transistor situated over the group III-V layer to one of an integrated passive element or another group III-V transistor situated over the group III-V layer. The PCM RF switch includes a heating element transverse to the PCM, the heating element underlying an active segment of the PCM. The PCM RF switch is configured to be electrically conductive when the active segment of the PCM is in a crystalline state, and to be electrically insulative when the active segment of the PCM is in an amorphous state.

26 Claims, 15 Drawing Sheets

Related U.S. Application Data a continuation-in-part of application No. 16/114,106, filed on Aug. 27, 2018, now Pat. No. 10,707,125, and a continuation-in-part of application No. 16/103,646, filed on Aug. 14, 2018, now Pat. No. 10,475,993, and a continuation-in-part of application No. 16/103,490, filed on Aug. 14, 2018, now Pat. No. 10,476,001.

(51) Int. Cl.
*H01L 45/00* (2006.01)
*H01L 21/8252* (2006.01)

(52) U.S. Cl.
CPC .......... *H01L 45/065* (2013.01); *H01L 45/126* (2013.01); *H01L 45/1226* (2013.01); *H01L 45/1286* (2013.01); *H01L 45/144* (2013.01); *H01L 45/1608* (2013.01)

(58) Field of Classification Search
CPC .............. H01L 45/1286; H01L 45/144; H01L 45/1608; H01L 45/126; H01L 45/06; H01L 45/143; H01L 27/2436; H01L 27/24; H01L 27/0694; H01L 27/0617
See application file for complete search history.

(56) References Cited

U.S. PATENT DOCUMENTS

| | | | |
|---|---|---|---|
| 6,535,545 B1 | 3/2003 | Ben-Bassat | |
| 7,522,029 B1 | 4/2009 | Lantz | |
| 8,314,983 B2 | 11/2012 | Frank | |
| 9,257,647 B2 | 2/2016 | Borodulin | |
| 9,362,492 B2 | 6/2016 | Goktepeli | |
| 9,368,720 B1 | 6/2016 | Moon | |
| 9,444,430 B1 | 9/2016 | Abdo | |
| 9,601,545 B1 | 3/2017 | Tu | |
| 9,640,759 B1 | 5/2017 | Curioni | |
| 9,865,654 B1* | 1/2018 | He | H01L 27/2436 |
| 9,891,112 B1 | 2/2018 | Abel | |
| 9,917,104 B1 | 3/2018 | Roizin | |
| 10,128,243 B2 | 11/2018 | Yoo | |
| 10,164,608 B2 | 12/2018 | Belot | |
| 10,461,253 B1 | 10/2019 | Slovin | |
| 10,505,106 B1 | 12/2019 | Joshi | |
| 10,529,922 B1 | 1/2020 | Howard | |
| 2005/0127348 A1 | 6/2005 | Horak | |
| 2006/0246712 A1 | 11/2006 | Kim | |
| 2007/0075347 A1 | 4/2007 | Lai | |
| 2007/0246766 A1 | 10/2007 | Liu | |
| 2008/0142775 A1 | 6/2008 | Chen | |
| 2008/0142777 A1 | 6/2008 | Park | |
| 2008/0272355 A1 | 11/2008 | Cho | |
| 2008/0291718 A1 | 11/2008 | Liu | |
| 2009/0065761 A1 | 3/2009 | Chen | |
| 2010/0084626 A1 | 4/2010 | Delhougne | |
| 2010/0238720 A1 | 9/2010 | Tio Castro | |
| 2010/0246247 A1 | 9/2010 | Kim | |
| 2011/0097825 A1 | 4/2011 | Cheng | |
| 2011/0291784 A1 | 12/2011 | Nakatsuji | |
| 2012/0037872 A1 | 2/2012 | Ikarashi | |
| 2013/0187120 A1 | 7/2013 | Redaelli | |
| 2013/0285000 A1 | 10/2013 | Arai | |
| 2014/0110657 A1 | 4/2014 | Redaelli | |
| 2014/0191181 A1* | 7/2014 | Moon | H01L 27/2409 257/4 |
| 2014/0264230 A1 | 9/2014 | Borodulin | |
| 2014/0339610 A1 | 11/2014 | Rashed | |
| 2015/0048424 A1 | 2/2015 | Tien | |
| 2015/0090949 A1 | 4/2015 | Chang | |
| 2015/0333131 A1 | 11/2015 | Mojumder | |
| 2016/0035973 A1 | 2/2016 | Raieszadeh | |
| 2016/0056373 A1 | 2/2016 | Goktepeli | |
| 2016/0071653 A1 | 3/2016 | Lamorey | |
| 2016/0308507 A1 | 10/2016 | Engelen | |
| 2017/0092694 A1 | 3/2017 | BrightSky | |
| 2017/0126205 A1 | 5/2017 | Lin | |
| 2017/0187347 A1 | 6/2017 | Rinaldi | |
| 2017/0207764 A1 | 7/2017 | Wang | |
| 2017/0243861 A1 | 8/2017 | Wang | |
| 2017/0365427 A1 | 12/2017 | Borodulin | |
| 2018/0005786 A1 | 1/2018 | Navarro | |
| 2018/0138894 A1 | 5/2018 | Belot | |
| 2018/0194615 A1 | 7/2018 | Nawaz | |
| 2018/0266974 A1 | 9/2018 | Khosravani | |
| 2018/0269393 A1 | 9/2018 | Zhang | |
| 2019/0064555 A1 | 2/2019 | Hosseini | |
| 2019/0067572 A1 | 2/2019 | Tsai | |
| 2019/0088721 A1 | 3/2019 | Reig | |
| 2019/0165264 A1 | 5/2019 | Wu | |
| 2019/0172657 A1 | 6/2019 | Zhu | |
| 2019/0267214 A1 | 8/2019 | Liu | |
| 2019/0296718 A1 | 9/2019 | Brikbeck | |

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

G. Slovin, et al. "AlN Barriers for Capacitance Reduction in Phase-Change RF Switches," in *IEEE Electron Device Letters*, vol. 37, No. 5, pp. 568-571, May 2016.

Moon, et al. "Phase-Change RF Switches with Robust Switching Cycle Endurance," *2018 IEEE Radio and Wireless Symposium (RWS)*, pp. 231-233, Jan. 2018, Anaheim, CA.

Wang, et al. "Directly Heated Four-Terminal Phase Change Switches," *2014 IEEE MTT-S International Microwave Symposium (IMS2014)*, pp. 1-4, Jun. 2014, Tampa, FL.

Tombak, et al. "Cellular Antenna Switches for Multimode Applications Based on a Silicon-on-Insulator Technology," *2010 IEEE Radio Frequency Integrated Circuits Symposium (RFIC)*, pp. 271-274, May 2010, Anaheim, CA.

\* cited by examiner

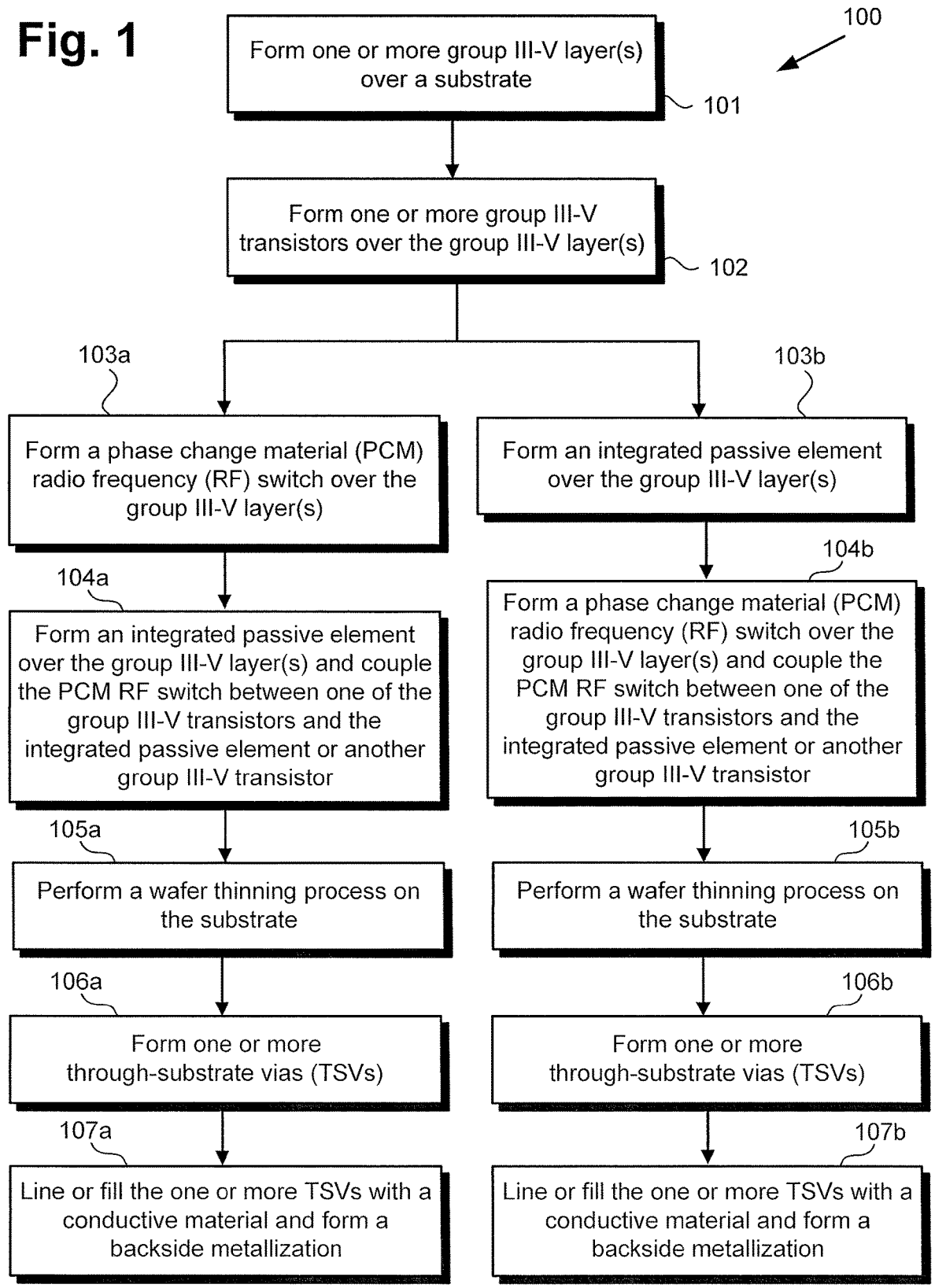

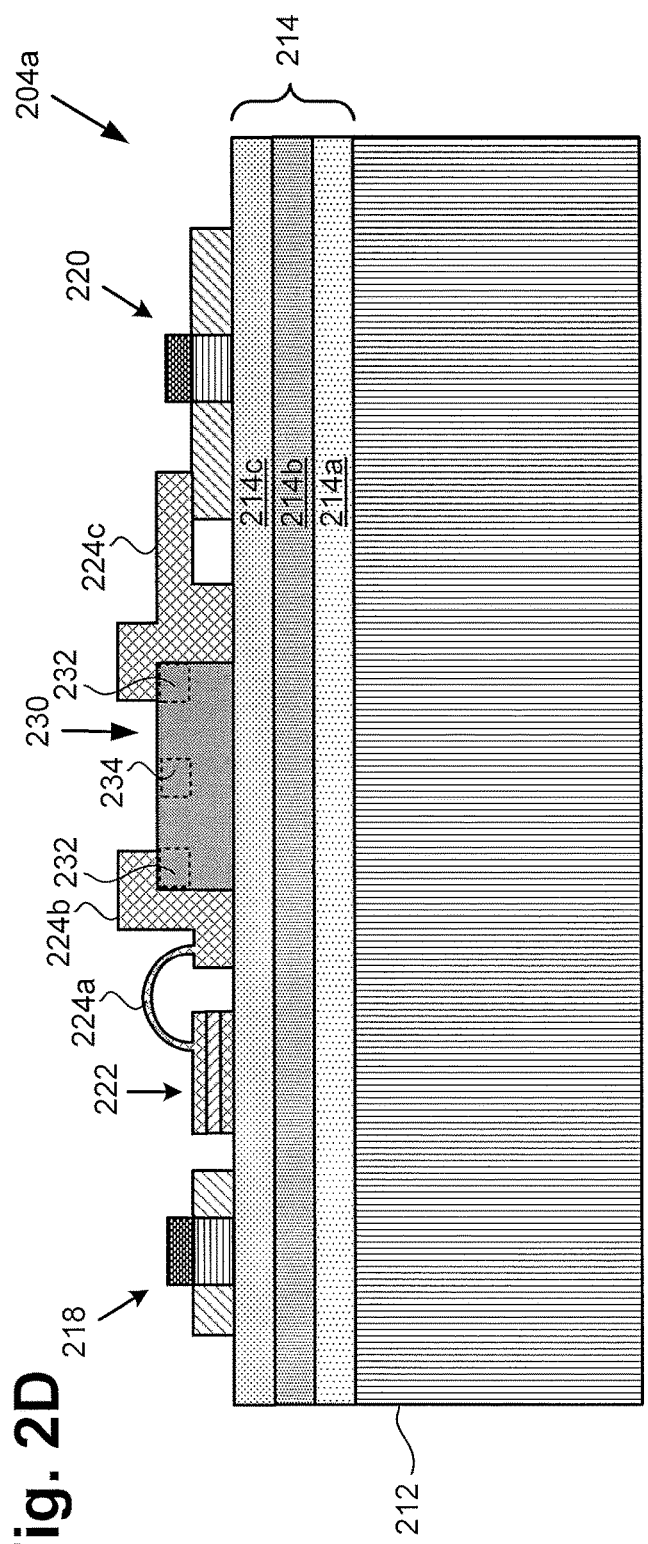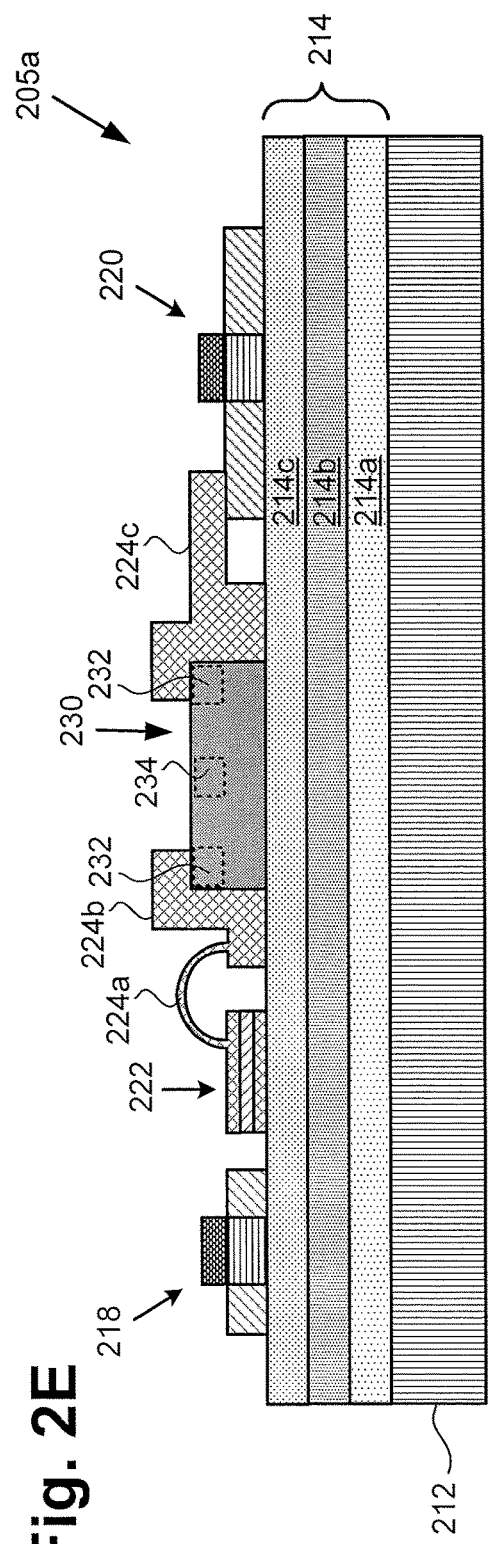

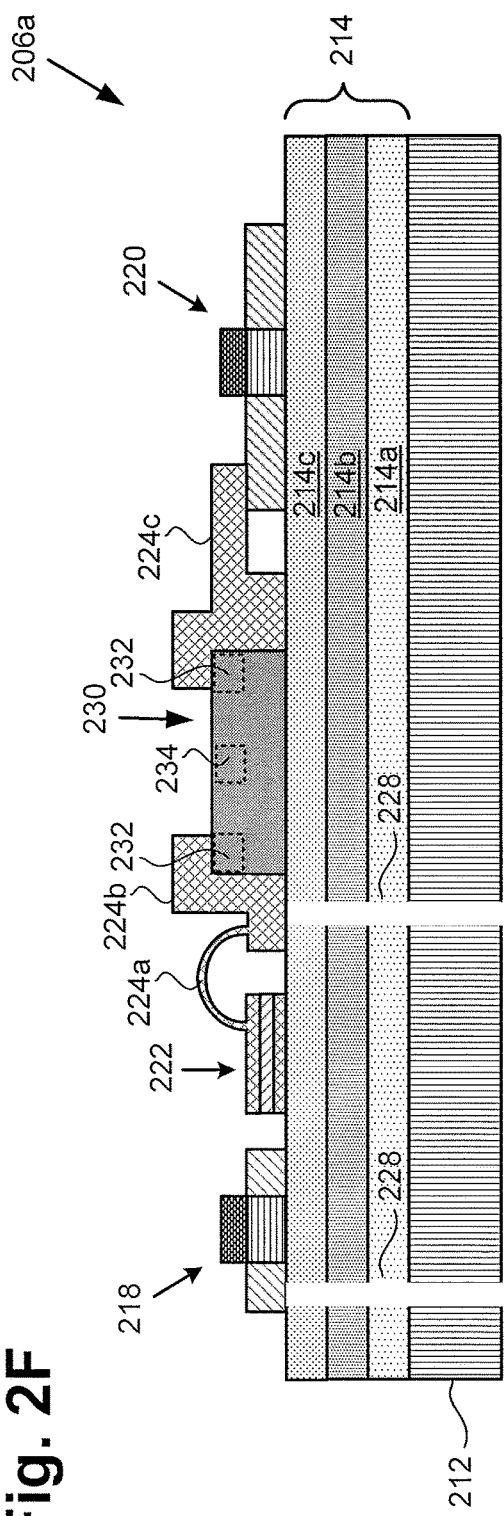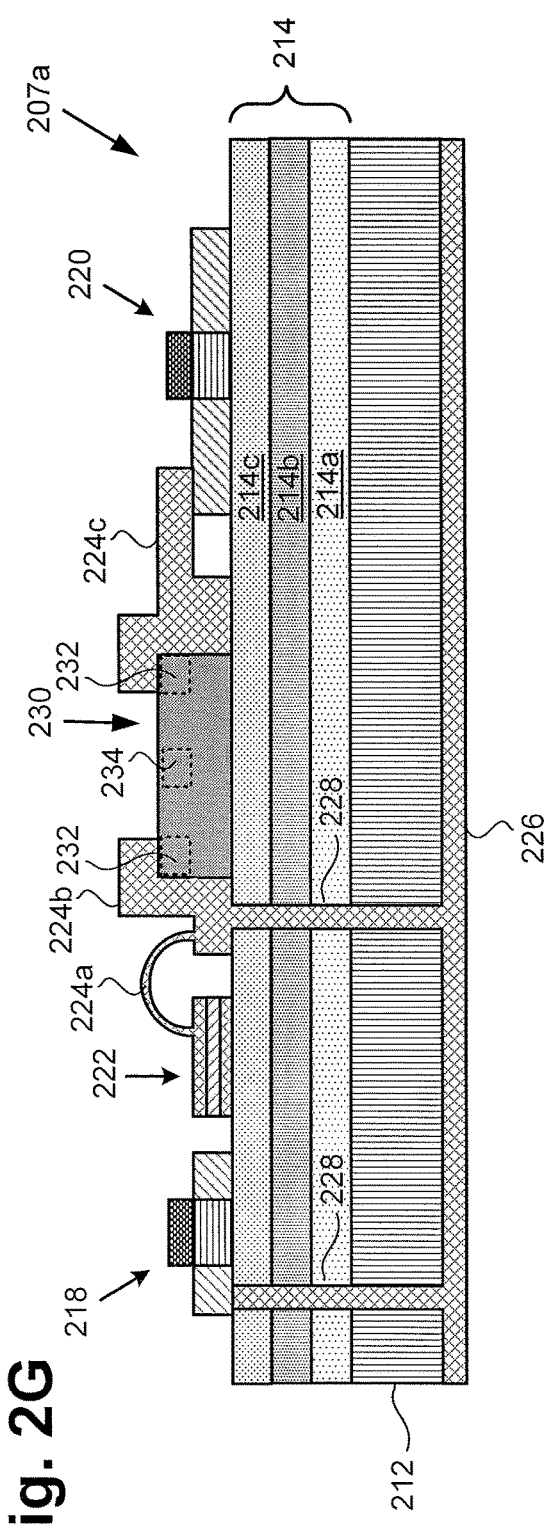

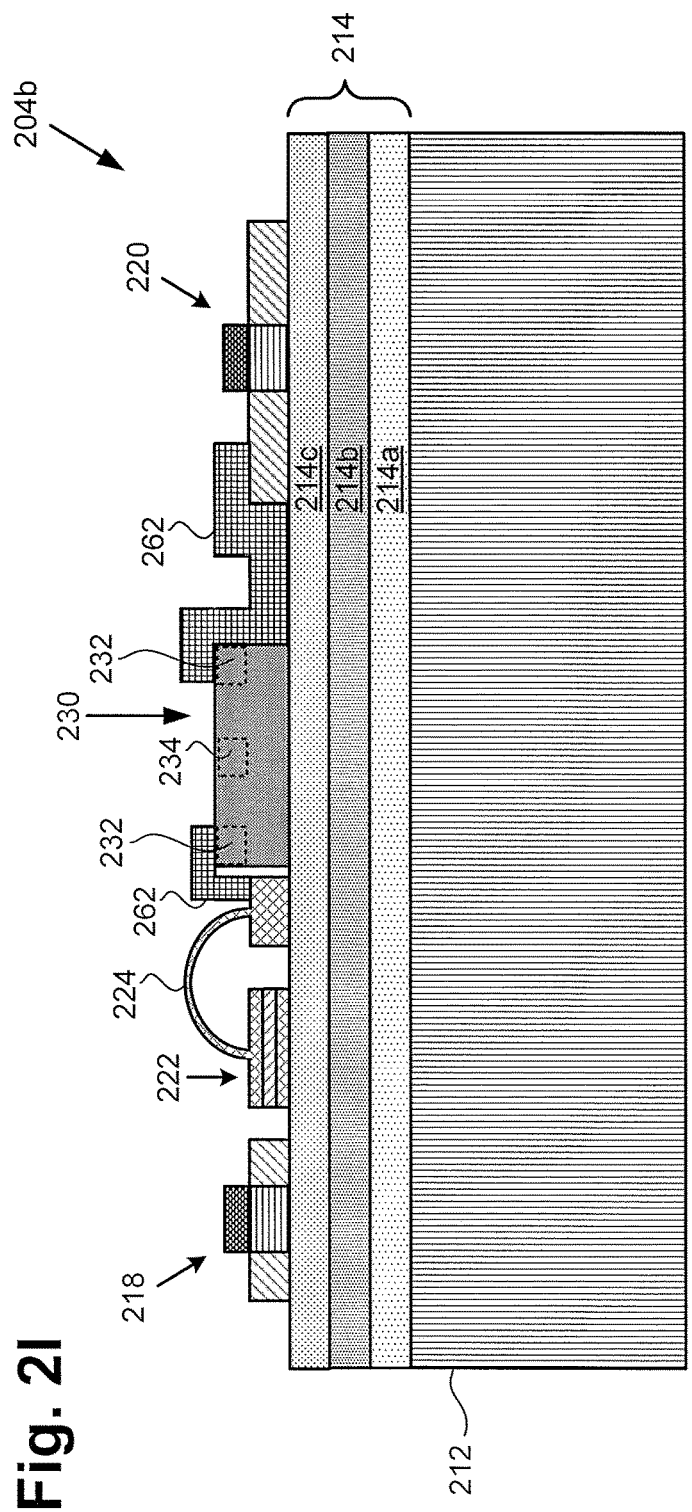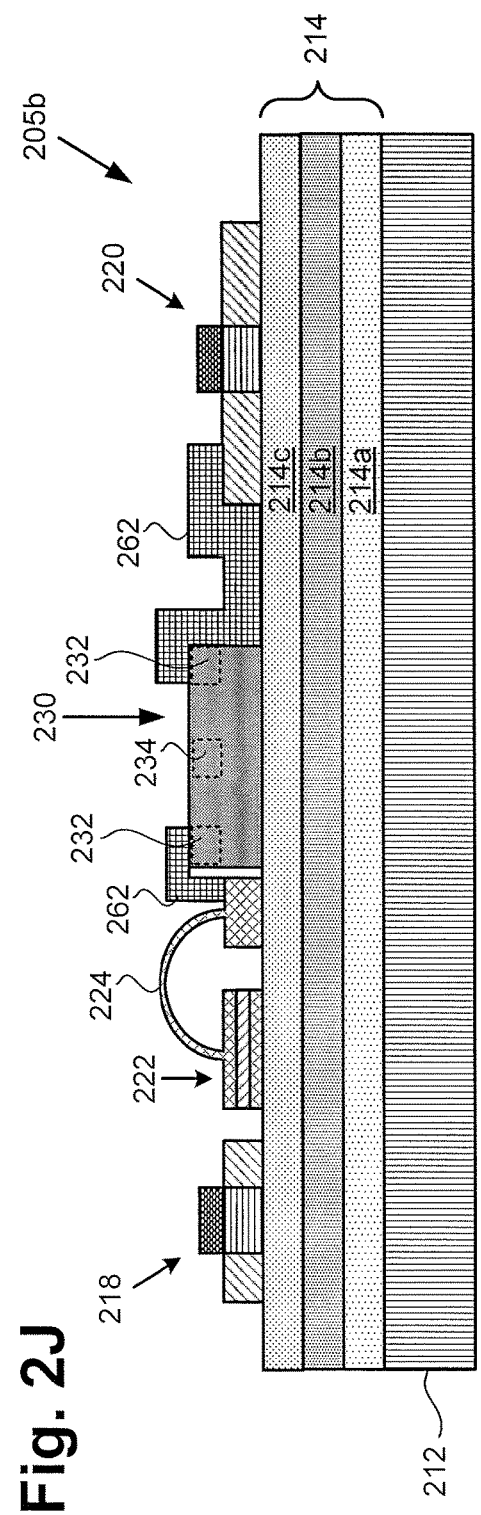

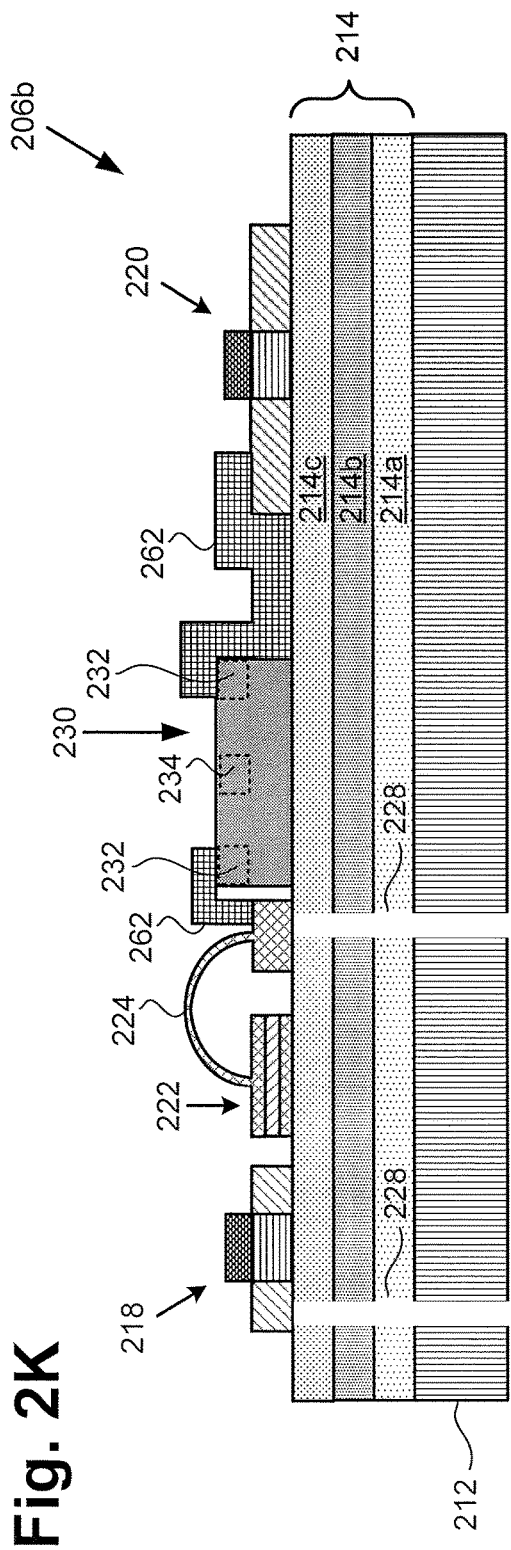
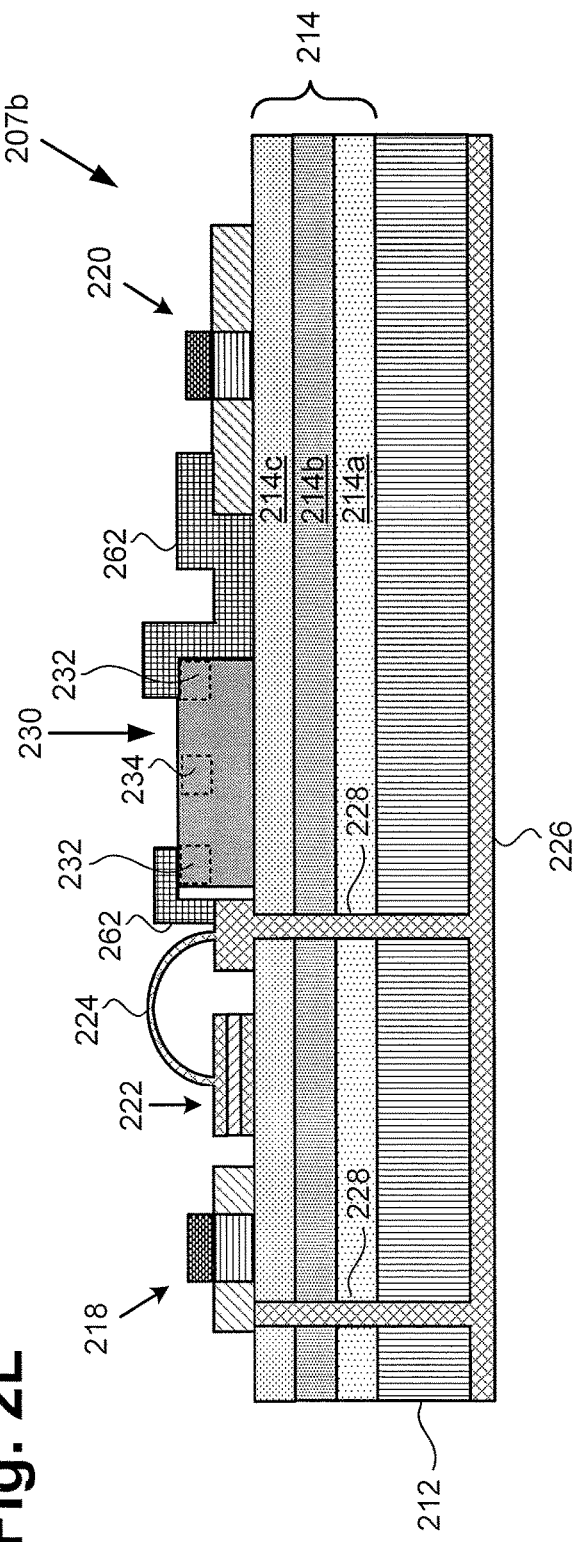
Fig. 2K
Fig. 2L

DEVICE INCLUDING PCM RF SWITCH INTEGRATED WITH GROUP III-V SEMICONDUCTORS

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material." The present application is also a continuation-in-part of and claims the benefit of and priority to application Ser. No. 16/103,646 filed on Aug. 14, 2018, titled "PCM RF Switch Fabrication with Subtractively Formed Heater." The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element." The present application is also a continuation-in-part of and claims the benefit of and priority to application Ser. No. 16/161,960, filed on Oct. 16, 2018, and titled "Phase-Change Material (PCM) Radio Frequency (RF) Switch with Reduced Parasitic Capacitance." The disclosures and contents of all of the above-identified applications are hereby incorporated fully by reference into the present application.

BACKGROUND

Group III-V semiconductors, such as gallium arsenide (GaAs) and gallium nitride (GaN) for example, are important materials for the fabrication of analog devices used in wireless and radio frequency (RF) communications, such as low noise amplifiers (LNAs), mixers, and high power amplifiers (HPAs). For instance, analog devices such as GaAs based heterojunction bipolar transistors (HBTs) and GaAs and GaN based high electron mobility transistors (HEMTs) are desirable due to their low noise and high power handling capabilities.

Despite their advantages in analog applications, switching a group III-V transistor into or out of an RF communication or wireless circuit typically results in RF power loss. As low-loss RF switches and circuits become more critical for high performance RF circuits and modules, reducing RF power loss due to switching has become an increasingly important design objective.

SUMMARY

The present disclosure is directed to a device including a PCM RF switch integrated with group III-V semiconductors as shown in and/or described in connection with at least one of the figures, and as set forth in the claims.

BRIEF DESCRIPTION OF THE DRAWINGS

FIG. 1 shows a flowchart presenting exemplary methods for fabricating a semiconductor device including a phase-change material (PCM) radio frequency (RF) switch, according to two alternative implementations.

FIG. 2D shows a cross-sectional view of the exemplary structure of FIG. 2C at a subsequent fabrication stage according to one implementation of the flowchart of FIG. 1.

FIG. 2E shows a cross-sectional view of the exemplary structure of FIG. 2D at a subsequent fabrication stage according to one implementation of the flowchart of FIG. 1.

FIG. 2F shows a cross-sectional view of the exemplary structure of FIG. 2E at a subsequent fabrication stage according to one implementation of the flowchart of FIG. 1.

FIG. 2G shows a cross-sectional view of an exemplary semiconductor device including a PCM RF switch, according to one implementation.

FIG. 2I shows a cross-sectional view of the exemplary structure of FIG. 2H at a subsequent fabrication stage according to an implementation of the flowchart of FIG. 1.

FIG. 2J shows a cross-sectional view of the exemplary structure of FIG. 2I at a subsequent fabrication stage according to an implementation of the flowchart of FIG. 1.

FIG. 2K shows a cross-sectional view of the exemplary structure of FIG. 2J at a subsequent fabrication stage according to an implementation of the flowchart of FIG. 1.

FIG. 2L shows a cross-sectional view of an exemplary semiconductor device including a PCM RF switch, according to another implementation.

DETAILED DESCRIPTION

Figure 2A:
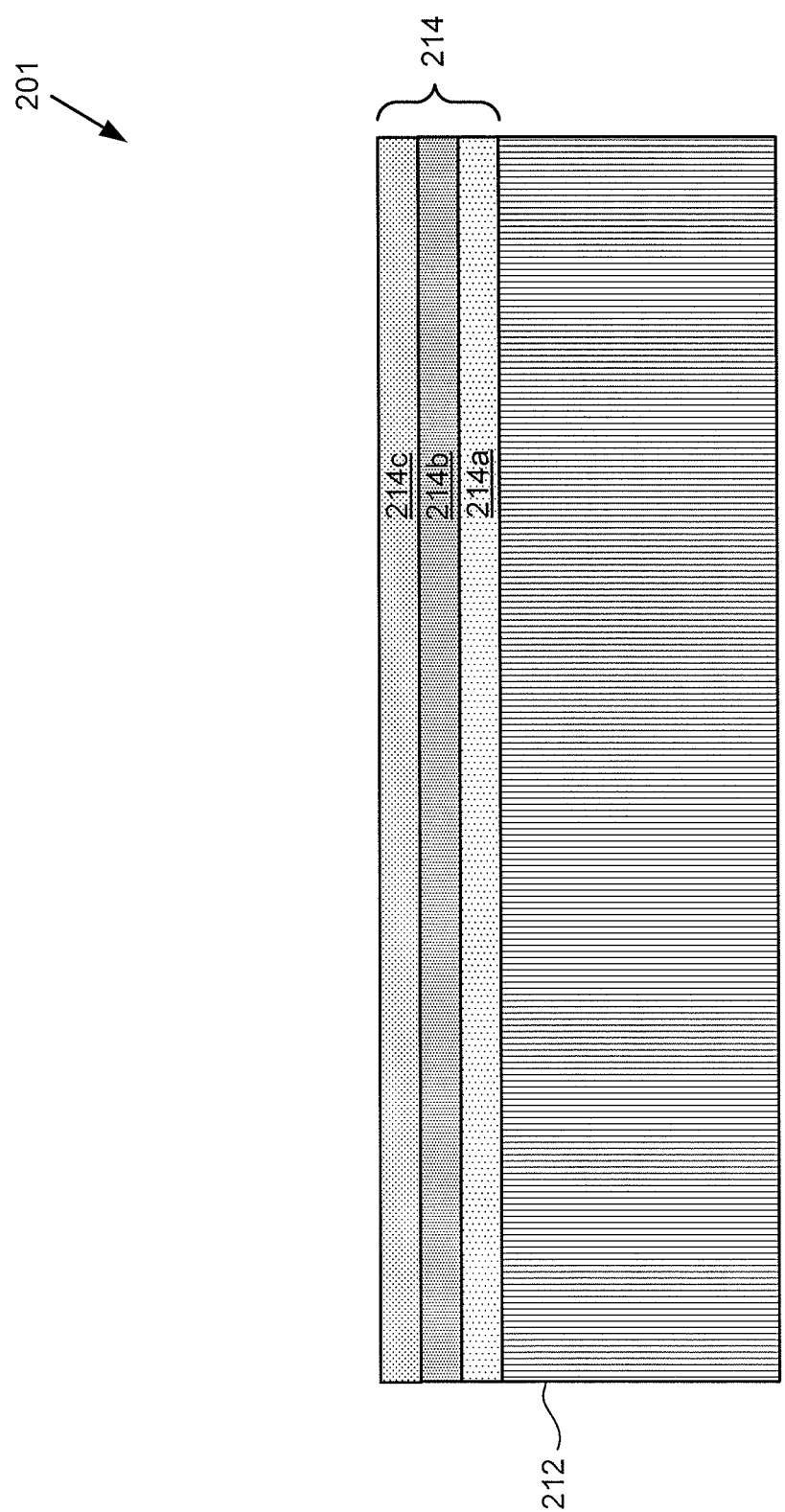
FIG. 2A shows a cross-sectional view of an exemplary structure corresponding to an initial fabrication stage according to one implementation of the flowchart of FIG. 1.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, Group III-V semiconductors, such as gallium arsenide (GaAs) and gallium nitride (GaN) for example, are used in wireless and radio frequency (RF) communications due to their low noise and high power handling capabilities. However, group III-V transistors and switches typically results in RF power loss. Utilizing low-loss RF switches is an important design objective in RF and wireless circuits.

The present application is directed to semiconductor devices including a phase-change material (PCM) radio frequency (RF) switch, and methods for fabricating such semiconductor devices. By integrating a PCM RF switch with a group III-V semiconductor structure on which one or more group III-V transistors are fabricated, the present application enables the use of a PCM RF switch to electrically connect and disconnect a group III-V transistor from other transistors or devices in the group III-V structure. Moreover, use of a PCM RF switch that is electrically conductive when an active segment of the PCM is in a crystalline state and electrically insulative when the active segment is in an amorphous state renders the III-V semiconductor device with which the PCM RF switch is integrated reconfigurable. As a result, integrating a PCM RF switch with group III-V transistors and devices advantageously provides a non-volatile reconfigurable semiconductor device characterized by low power loss.

FIG. 1 shows flowchart 100 presenting exemplary methods for fabricating a group III-V semiconductor device including a PCM RF switch, according to two alternative implementations. It is noted that certain details and features have been left out of flowchart 100 that are apparent to a person of ordinary skill in the art, in order not to obscure the discussion of the inventive features in the present application.

Referring now to FIG. 2A, FIG. 2A shows a cross-sectional view of exemplary structure 201 corresponding to an initial fabrication stage of the flowchart of FIG. 1. It is noted that substrate 212 of structure 201 is selected so as to be suitable for use as a support substrate for one or more group III-V transistors, while group III-V layer or layers 214 (hereinafter "group III-V layer(s) 214") are selected to be suitable for fabricating the one or more group III-V transistors. Proceeding to FIG. 2B, cross-sectional structure 202 shows the result of forming one or more group III-V transistors (218, 220) over one or more of group III-V layer(s) 214.

With respect to FIGS. 2C, 2D, 2E, 2F, and 2G (hereinafter "FIGS. 2C-2G"), it is noted that FIGS. 2A, 2B, and 2C-2G depict one implementation of the method of flowchart 100 described by respective actions 101, 102, 103a, 104a, 105a, 106a, and 107a. Regarding FIGS. 2H, 2I, 2J, 2K, and 2L (hereinafter "FIGS. 2H-2L"), it is further noted that FIGS. 2A, 2B, and 2H-2L depict another implementation of the method of flowchart 100 described by respective actions 101, 102, 103b, 104b, 105b, 106b, and 107b.

It is also noted that the cross-sectional structures shown in FIGS. 2A, 2B, 2C-2G, and 2H-2L are provided as specific implementations of the present inventive principles, and are shown with such specificity for the purposes of conceptual clarity. It should also be understood that particular details such as the materials used to form the cross-sectional structures shown in FIGS. 2A, 2B, 2C-2G, and 2H-2L, and the techniques used to produce the various depicted features, are being provided merely as examples, and should not be interpreted as limitations.

Referring to cross-sectional structure 201, in FIG. 2A, with further reference to FIG. 1, flowchart 100 begins with forming group III-V layer(s) 214 over substrate 212 (action 101). As noted above, substrate 212 may include any material suitable for use as a substrate for fabrication of one or more group III-V transistors. Examples of group III-V transistors for which substrate 212 may be utilized include group III-V heterostructure devices such as heterostructure field-effect transistors (HFETs), group III-V high electron mobility transistors (HEMTs), and group III-V heterojunction bipolar transistors (HBTs).

Substrate 212 may be a silicon carbide (SiC), or may be a native group III-V substrate, such as a GaAs, GaN, or indium phosphide (InP) substrate, for example. Moreover, although substrate 212 is shown as a substantially unitary substrate in FIG. 2A, in other implementations, substrate 212 may be a composite substrate, such as a single-crystal or polycrystalline SiC on silicon or, alternatively, an SOI (silicon-on-insulator) substrate, for example.

Group III-V layer(s) 214 may include any of a wide variety of group III-V materials. For example, one or more of group III-V layer(s) may include GaAs, aluminum gallium arsenide (AlGaAs), indium gallium arsenide (InGaAs), InP, indium gallium nitride (InGaN), indium gallium phosphide (InGaP), GaN, gallium phosphide (GaP), aluminum nitride (AlN), and aluminum gallium nitride (AlGaN).

In implementations in which substrate 212 is a non-native substrate for fabrication of a group III-V transistor, group III-V layer(s) 214 may include layer 214a as a nucleation layer in the form of an AlN layer, for example. Moreover, in those implementations, layer 214b may correspond to multiple transition layers, in some implementations including a GaAs or GaN buffer layer, for example, situated between substrate 212 and a subsequently formed group III-V transistor. As a specific example, where substrate 212 is a SiC substrate, layer 214b may correspond to multiple distinguishable group III-V layers helping to mediate the lattice transition from substrate 212 to active layer or layers 214c for the overlying group III-V transistor or transistors (group III-V transistor(s) not shown in FIG. 2A).

Group III-V layer(s) 214 may be formed using any suitable technique known in the art. For example, in one implementation, group III-V layer(s) 214 may be formed using metalorganic chemical vapor deposition (MOCVD). Moreover, in some implementations, group III-V layer(s) 214 may be epitaxial layers formed using molecular-beam epitaxy (MBE) or hydride vapor phase epitaxy (HVPE), to name two suitable techniques.

Figure 2B:
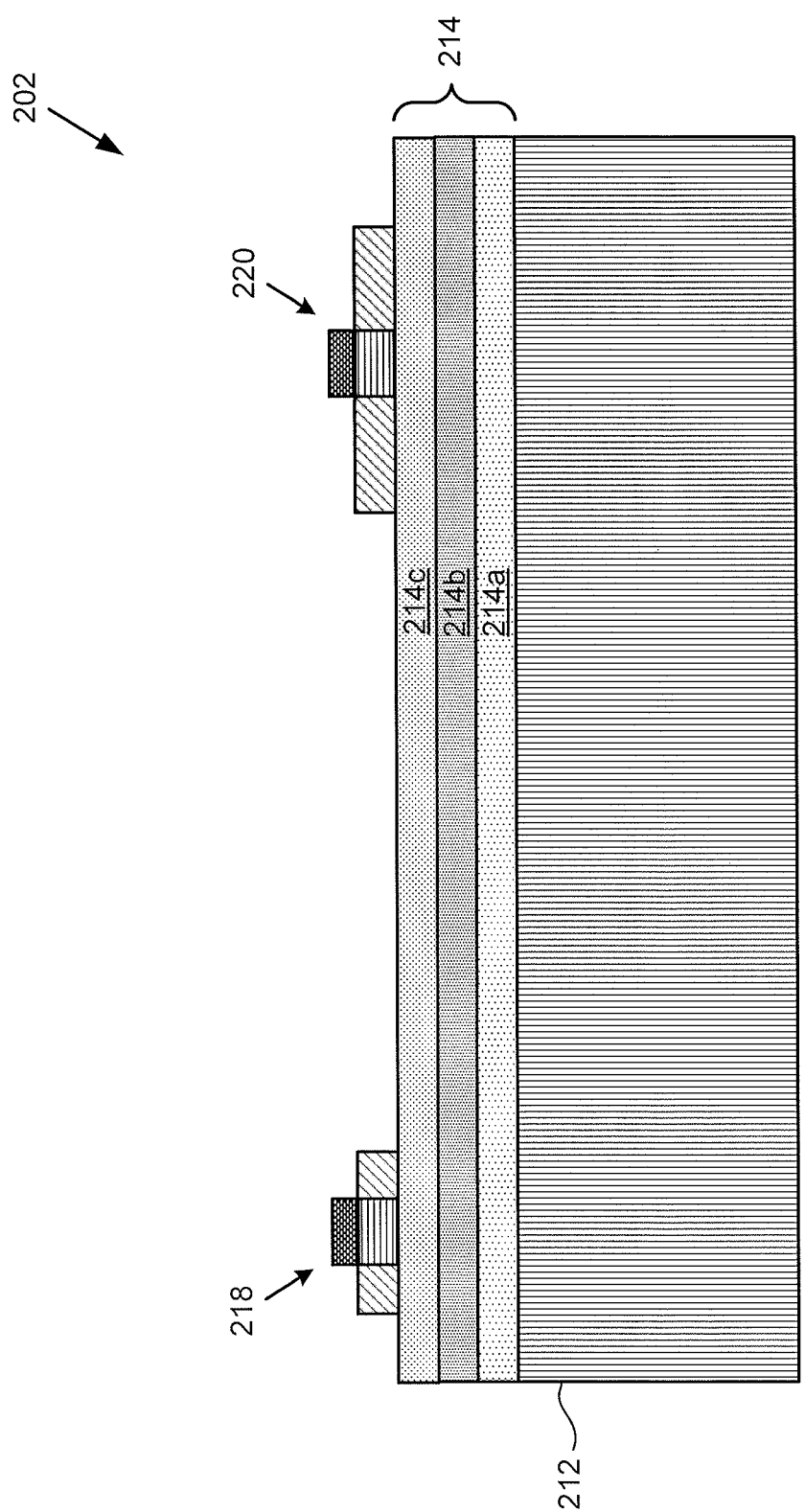
FIG. 2B shows a cross-sectional view of the exemplary structure of FIG. 2A at a subsequent fabrication stage according to one implementation of the flowchart of FIG. 1.
Figure 2C:
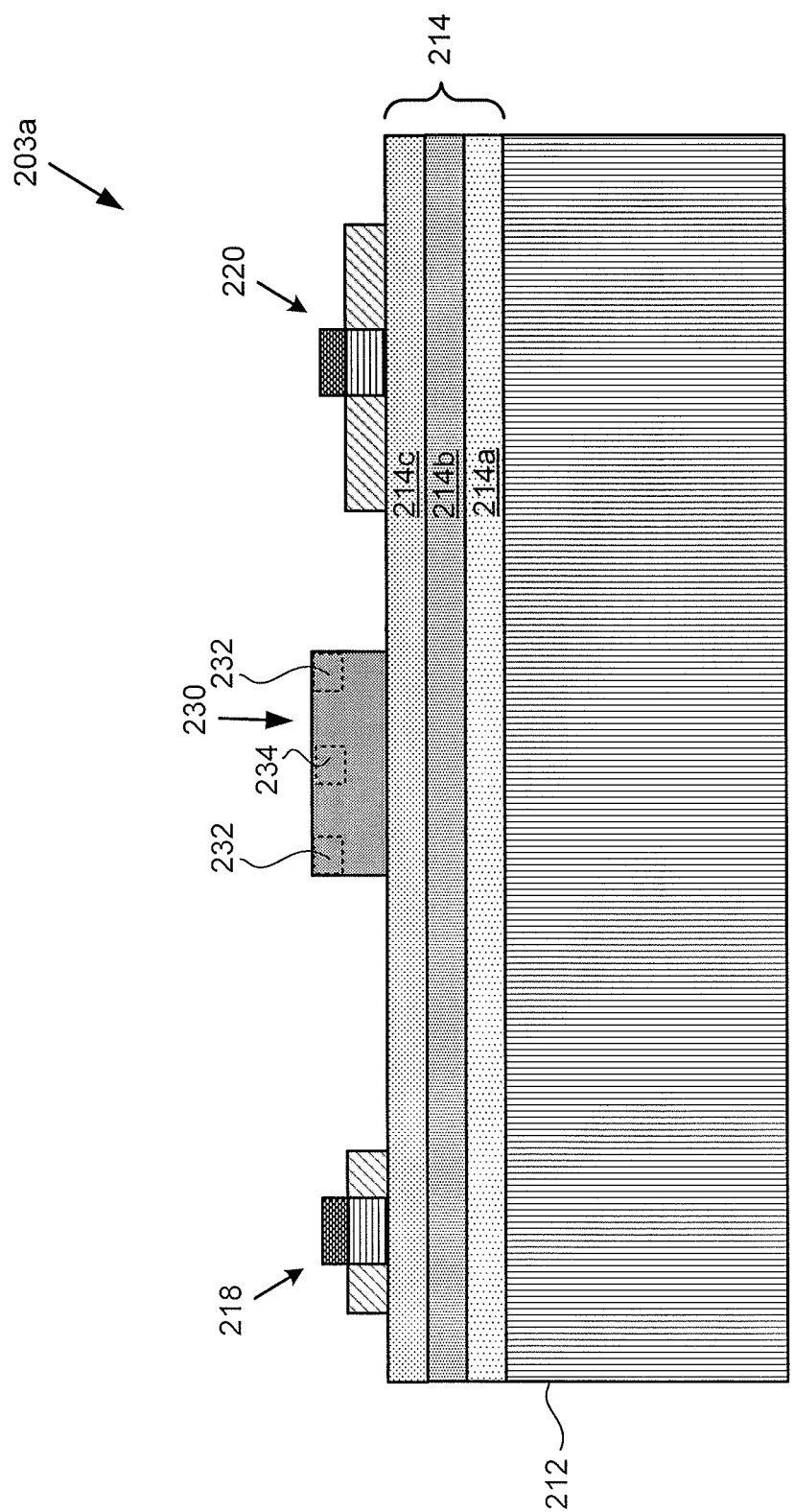
FIG. 2C shows a cross-sectional view of the exemplary structure of FIG. 2B at a subsequent fabrication stage according to one implementation of the flowchart of FIG. 1.

Turning to cross-sectional structure 202, in FIG. 2B, with further reference to FIG. 1, flowchart 100 continues with forming one or more group III-V transistors 218 and 220 over group III-V layer(s) 214 (action 102). Group III-V transistors 218 and 220 may be implemented as group III-V heterostructure devices such as HFETs, group III-V HEMTs, or group III-V HBTs, for example. For instance, one or both of group III-V transistors 218 and 220 may take the form of a GaAs or GaN based HEMT, or a GaAs based HBT.

Depending on the particular implementation of group III-V transistors 218 and 220, action 102 may include dopant implantation to form gate, source, and drain regions, or base, emitter, and collector regions, as well as formation of gate or base electrodes. Alternatively, in some implementations, formation of group III-V transistors 218 and 220 may include configuring a channel layer and barrier layer to produce a two-dimensional electron gas (2DEG) near their interface.

Figure 3:
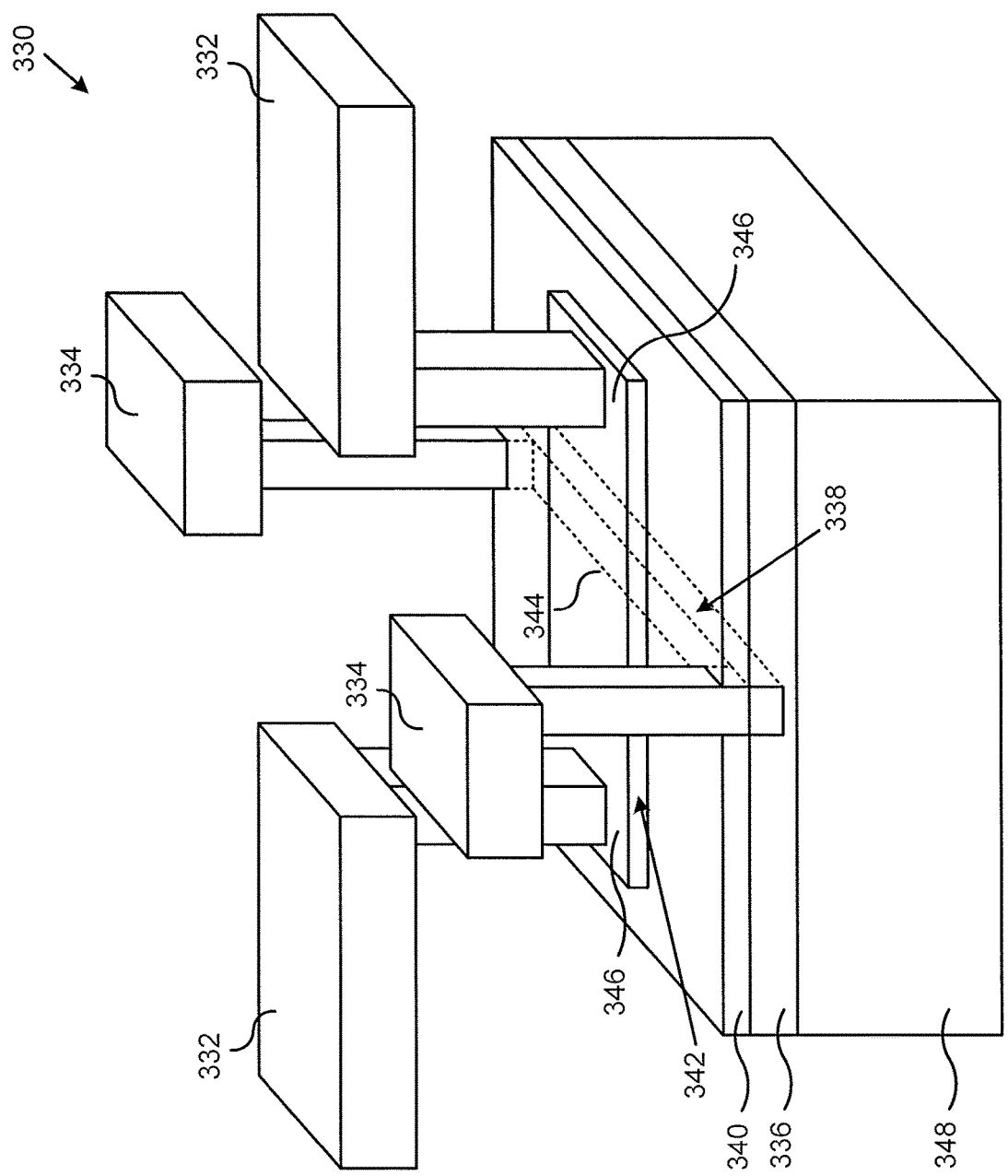
FIG. 3 shows a perspective view of a portion of a PCM RF switch, according to one exemplary implementation.

According to one exemplary implementation, the method of flowchart 100 continues with forming PCM RF switch 230 over group III-V layer(s) 214 (action 103a). As shown by cross-sectional structure 203a in FIG. 2C, PCM RF switch 230 may include PCM contacts 232 and heating element contacts 234 transverse to PCM contacts 232. A more detailed exemplary implementation of PCM RF switch 230 is shown by FIG. 3 and is described below with reference to that figure. Accordingly, formation of PCM RF switch 230 may include formation of one or more dielectric layers, a heating element, the PCM, PCM contacts 232, and heating element contacts 234.

It is noted that although flowchart 100 describes group III-V layer(s) 214 being formed over substrate 212, and group III-V transistors 218 and 220 being formed over group III-V layer(s) 214, in some implementations, group III-V layer(s) 214 and group III-V transistors 218 and 220 may be formed ex situ. In those cases, for example, one implementation of the method of flowchart 100 may begin with action 103a, rather than action 101.

Referring to cross-sectional structure 204a, in FIG. 2D, in one implementation, flowchart 100 may continue with forming integrated passive element 222 over group III-V layer(s) 214 and coupling PCM RF switch 230 between one of group III-V transistors 218 and 220 and integrated passive element 222 or the other of group III-V transistors 218 and 220 (action 104a). It is noted that although integrated passive element 222 is depicted as a capacitor in the present figures, that implementation is merely exemplary. In other implementations, integrated passive element 222 may correspond to any of a capacitor, a resistor, an inductor, or a transmission line.

As shown in FIG. 2D, in some implementations, formation of integrated passive element 222 includes formation of front side metallization contacts 224a, 224b, and 224c. Front side metallization contacts 224a, 224b, and 224c may comprise gold (Au), for example, as the result of plating or through evaporative deposition. Thus, according to the present exemplary method, integrated passive element 222 and front side metallization contacts 224a, 224b, and 224c are formed after forming PCM RF switch 230.

According to the exemplary implementation shown in FIG. 2D, front side metallization contact 224a electrically couples integrated passive element 222 to front side metallization contact 224b, while front side metallization contact 224b connects to one of PCM contacts 232 of PCM RF switch 230. As further shown by FIG. 2D, according to the present exemplary implementation, front side metallization contact 224c electrically couples the other of PCM contacts 232 of PCM RF switch 230 to group III-V transistor 220.

Continuing to cross-sectional structure 205a, in FIG. 2E, in one implementation, flowchart 100 may further include performing a wafer thinning process on substrate 212 (action 105a). Thinning of substrate 212 may be performed using any suitable technique known in the art. For example, in one implementation, wafer thinning of substrate 212 may be performed through backgrinding of substrate 212.

Referring to cross-sectional structure 206a, in FIG. 2F, in one implementation, flowchart 100 may continue with forming one or more through-substrate vias (TSVs) 228 (action 106a). As shown in FIG. 2F, TSVs 228 may extend through substrate 212, as well as through one or more of group III-V layer(s) 214. TSVs 228 may be formed using conventional semiconductor fabrication techniques, such as photolithography, and plasma or chemical etching.

Flowchart 100 can conclude with lining or filling TSVs 228 with a conductive material and forming backside metallization 226 on the backside of thinned substrate 212 (action 107a). In one implementation, TSVs 228 may be lined or filled using the same conductive material used to form backside metallization 226. For example, TSVs 228 may be lined or filled using gold (Au), while backside metallization may also be formed of gold, as the result of plating or through evaporative deposition.

As shown by cross-sectional structure 207a in FIG. 2G, PCM RF switch 230 may be coupled to group III-V transistor 218 using TSVs 228, backside metallization 226, and front side metallization contact 224b. As also shown in FIG. 2G, PCM RF switch 230 may be further coupled to group III-V transistor 220 using front side metallization contact 224c. Thus, according to the present exemplary implementations, PCM RF switch 230 is coupled between group III-V transistor 218 and group III-V transistor 220 using TSVs 228, backside metallization 226, and front side metallization contacts 224b and 224c.

As is discussed in greater detail below by reference to FIG. 3, PCM RF switch 230 may be made selectively conductive or selectively insulative according to the phase state of its active PCM segment. Consequently, coupling PCM RF switch 230 between group III-V transistor 218 and group III-V transistor 220 advantageously provides a non-volatile, low-loss, switching solution for selectively making or breaking an electrical connection between group III-V transistor 218 and group III-V transistor 220.

Figure 2H:
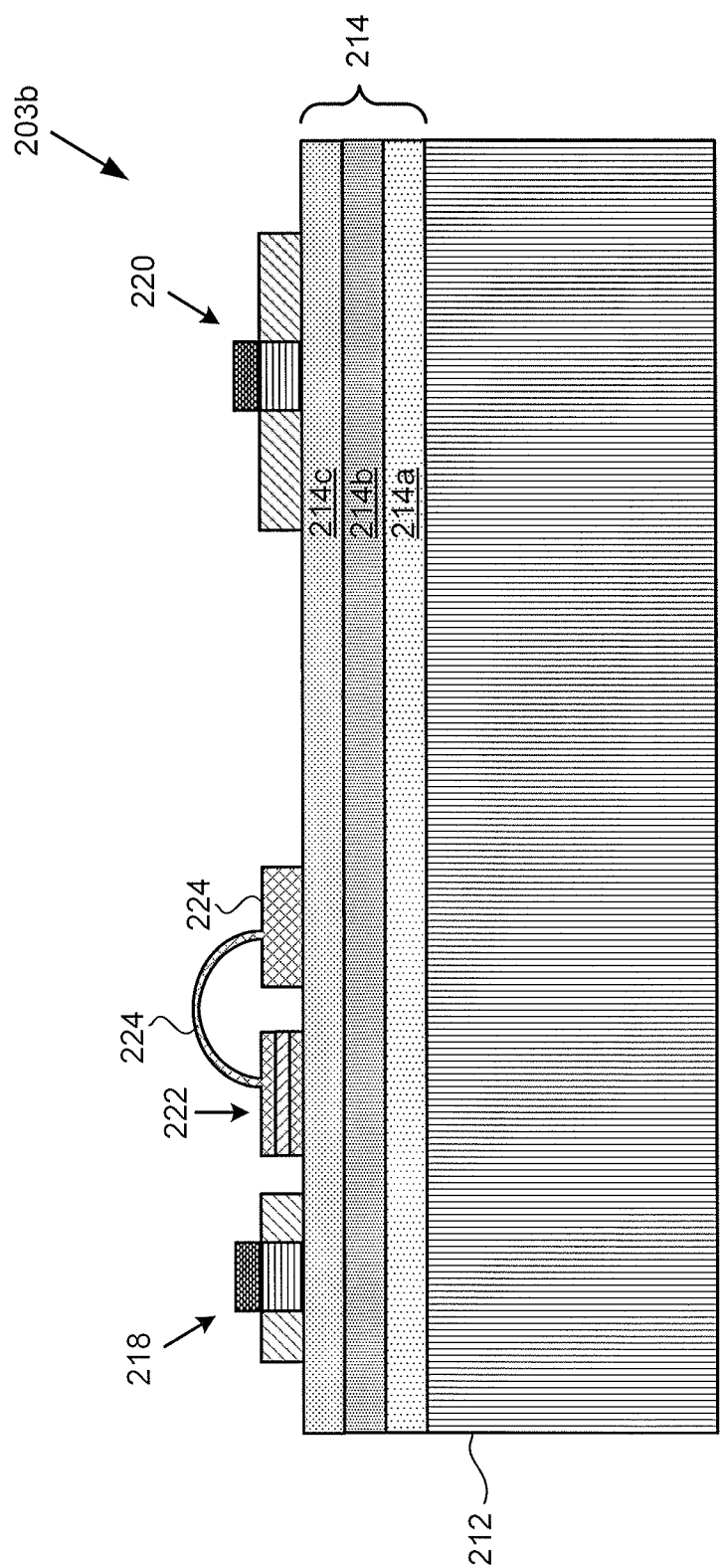
FIG. 2H shows a cross-sectional view of the exemplary structure of FIG. 2B at a subsequent fabrication stage according to another implementation of the flowchart of FIG. 1.

Referring to cross-sectional structure 203b, in FIG. 2H, according to an alternative implementation of the method of flowchart 100, action 102 may be followed by action 103b, rather than 103a. That is to say, following formation of cross-sectional structure 202, in FIG. 2B, flowchart 100 can continue with forming integrated passive element 222 over group III-V layer(s) 214 (action 103b).

As noted above, although integrated passive element 222 is depicted as a capacitor in the present figures, that implementation is merely exemplary. In other implementations, integrated passive element 222 may correspond to any of a capacitor, a resistor, an inductor, or a transmission line. As shown in FIG. 2H, in some implementations, formation of integrated passive element 222 includes formation of front side metallization contacts 224. Front side metallization contacts 224 may be formed of gold (Au), for example, as the result of plating or through evaporative deposition.

As also noted above, although flowchart 100 describes group III-V layer(s) 214 being formed over substrate 212, and group III-V transistors 218 and 220 being formed over group III-V layer(s) 214, in some implementations, group III-V layer(s) 214 and group III-V transistors 218 and 220 may be formed ex situ. In those cases, for example, one implementation of the method of flowchart 100 may begin with action 103b, rather than action 101.

According to the present exemplary implementation, the method of flowchart 100 continues with forming PCM RF switch 230 over group III-V layer(s) 214 and coupling PCM RF switch 230 between one of group III-V transistors 218 and 220 and integrated passive element 222 or the other of group III-V transistors 218 and 220 (action 104b). As shown by cross-sectional structure 204b in FIG. 2I, PCM RF switch 230 may include PCM contacts 232 and heating element contacts 234 transverse to PCM contacts 232. As noted above, a more detailed exemplary implementation of PCM RF switch 230 is shown by FIG. 3 and is described below with reference to that figure. Accordingly, formation of PCM RF switch 230 may include formation of one or more dielectric layers, a heating element, the PCM, PCM contacts 232, and heating element contacts 234.

As shown in FIG. 2I, in some implementations, formation of PCM RF switch 230 includes formation of conductive interconnects 262. Thus, according to the present exemplary method, integrated passive element 222 and front side metallization contacts 224 are formed prior to forming PCM RF switch 230 and conductive interconnects 262.

Conductive interconnects 262 may be formed of any suitable conductive material, such as copper (Cu), aluminum (Al), or gold (Au). In one implementation, conductive interconnects 262 may be formed of gold, for example, as the result of plating or through evaporative deposition. As further shown in FIG. 2I, according to one exemplary implementation, front side metallization contacts 224 and one of conductive interconnects 262 electrically couple integrated passive element 222 to one of PCM contacts 232 of PCM RF switch 230. Moreover, according to the present exemplary implementation, another of conductive interconnects 262 electrically couples the other of PCM contacts 232 of PCM RF switch 230 to group III-V transistor 220.

Continuing to cross-sectional structure 205b, in FIG. 2J, in one implementation, flowchart 100 may further include performing a wafer thinning process on substrate 212 (action 105b). As noted above, thinning of substrate 212 may be performed using any suitable technique known in the art. For example, in one implementation, wafer thinning of substrate 212 may be performed through backgrinding of substrate 212.

Referring to cross-sectional structure 206b, in FIG. 2K, in one implementation, flowchart 100 may continue with forming one or more TSVs 228 (action 106b). As shown in FIG. 2K, TSVs 228 may extend through substrate 212, as well as through one or more of group III-V layer(s) 214. As stated above, TSVs 228 may be formed using conventional semiconductor fabrication techniques, such as photolithography, and plasma or chemical etching.

Flowchart 100 can conclude with lining or filling TSVs 228 with a conductive material and forming backside metallization 226 on the backside of thinned substrate 212 (action 107b). In one implementation, TSVs 228 may be lined or filled using the same conductive material used to form backside metallization 226. For example, TSVs 228 may be lined or filled using gold (Au), while backside metallization may also be formed of gold, as the result of plating or through evaporative deposition.

As shown by cross-sectional structure 207b in FIG. 2L, PCM RF switch 230 may be coupled to group III-V transistor 218 using TSVs 228, backside metallization 226, front side metallization contact 224, and one of conductive interconnects 262. As also shown in FIG. 2L, PCM RF switch 230 may be further coupled to group III-V transistor 220 by another of conductive interconnects 262. Thus, according to the present exemplary implementations, PCM RF switch 230 is coupled between group III-V transistor 218 and group III-V transistor 220 using TSVs 228, backside metallization 226, front side metallization contact 224, and conductive interconnects 262.

As noted above and as discussed in greater detail below by reference to FIG. 3, PCM RF switch 230 may be made selectively conductive or selectively insulative according to the phase state of its active PCM segment. Consequently, coupling PCM RF switch 230 between group III-V transistor 218 and group III-V transistor 220 advantageously provides a non-volatile, low-loss, switching solution for selectively making or breaking an electrical connection between group III-V transistor 218 and group III-V transistor 220.

Referring now to FIG. 3, FIG. 3 shows a perspective view of a portion of PCM RF switch 330, according to one exemplary implementation. As shown in FIG. 3, PCM RF switch 330 may include lower dielectric 336, heating element 338, thermally conductive and electrically insulating material 340, PCM 342 having active segment 344 and passive segments 346, PCM contacts 332, and heating element contacts 334. In addition, in some implementations, PCM RF switch 330 may include integrated heat spreader 348, which may be formed of metal or any suitable thermally conductive material or materials. For purposes of illustration, the perspective view in FIG. 3 shows selected structures of PCM RF switch 330. However, it is noted that PCM RF switch 330 may include other features not shown in FIG. 3.

PCM RF switch 330, PCM contacts 332, and heating element contacts 334 correspond respectively in general to PCM RF switch 230, PCM contacts 232, and heating element contacts 234 in FIGS. 2C-2G, 2I, 2J, 2K, and 2L. That is to say, PCM RF switch 230, PCM contacts 232, and heating element contacts 234 may share any of the characteristics attributed to respective PCM RF switch 330, PCM contacts 332, and heating element contacts 334 by the present disclosure, and vice versa. Thus, although not shown in FIGS. 2C-2G, 2I, 2J, 2K, and 2L, PCM RF switch 230 may include any or all of the features shown in FIG. 3 and described herein.

In implementations in which PCM RF switch 230/330 includes integrated heat spreader 348, lower dielectric 336 in PCM RF switch 230/330 may be situated over and interface integrated heat spreader 348. However, in some implementations, PCM RF switch 230/330 may omit integrated heat spreader 348, and may be configured to utilize one or more of group III-V layer(s) 214 and/or substrate 212 as a heat spreader. That is to say, in some implementations, PCM RF switch 230/330 may interface a heat spreader provided by one of group III-V layer(s) 214 formed of thermally conductive AlN, GaN, GaP, or AlGaN, for example. Furthermore, in some implementations, PCM RF switch 230/330 may interface substrate 212 directly, in which case substrate 212 formed of a thermally conductive material such as GaN or SiC, for example, may serve as a heat spreader for PCM RF switch 230/330.

As shown in FIG. 3, lower dielectric 336 may be adjacent to the sides of heating element 338. Lower dielectric 336 may include a material with thermal conductivity lower than that of thermally conductive and electrically insulating material 340. In various implementations, lower dielectric 336 may be formed of silicon oxide ($SiO_2$,) silicon nitride (SiN), or another dielectric. In various implementations, lower dielectric 336 may have a relative thickness greater or less than shown in FIG. 3.

As shown in FIG. 3, heating element 338 of PCM RF switch 230/330 may be situated in lower dielectric 336, and underlies PCM 342. Heating element 338 is configured to generate a crystallizing pulse or an amorphizing pulse for transforming active segment 344 of PCM 342. Heating element 338 can include any material capable of Joule heating. Heating element 338 can be connected to electrodes of a current source (not shown in FIG. 3) that generates a crystallizing pulse or an amorphizing pulse. It may be advantageous or desirable for heating element 338 to be formed of a material that exhibits minimal electromigration or substantially no electromigration. In various implementations, heating element 338 can include a metal such as tungsten (W), molybdenum (Mo), titanium (Ti), titanium tungsten (TiW), titanium nitride (TiN), tantalum (Ta), nickel chromium (NiCr), or nickel chromium silicon (NiCrSi). For example, in one implementation, heating element 338 includes tungsten lined with titanium and titanium nitride.

Thermally conductive and electrically insulating material 340 of PCM RF switch 230/330 is shown to be situated on top of heating element 338 and lower dielectric 336, and under PCM 342 and, in particular, under active segment 344 of PCM 342. Thermally conductive and electrically insulating material 340 is included in PCM RF switch 230/330 to ensure efficient heat transfer between heating element 338 and active segment 344 of PCM 342, while impeding electrical signals from leaking out from the path between PCM contacts 232/332 to heating element 338 or to other neighboring structures. Thermally conductive and electrically insulating material 340 can be formed of any material with high thermal conductivity and high electrical resistivity. In various implementations, thermally conductive and electrically insulating material 340 can include aluminum nitride (AlN), aluminum oxide ($Al_xO_y$), beryllium oxide ($Be_xO_y$), silicon carbide (SiC), diamond, or diamond-like carbon.

PCM 342 of PCM RF switch 230/330 is shown to be situated on top of thermally conductive and electrically insulating material 340. PCM 342 includes active segment 344 and passive segments 346. Active segment 344 of PCM 342 approximately overlies heating element 338. Passive segments 346 of PCM 342 extend outward and are transverse to heating element 338, and are situated approximately under PCM contacts 332. As used herein, "active segment" refers to a segment of PCM 342 that transforms between crystalline and amorphous states, for example, in response to a crystallizing or an amorphizing heat pulse, whereas "passive segment" refers to a segment of PCM 342 that does not make such transformation and maintains a crystalline state (i.e., maintains a conductive state). With proper heat pulses and heat dissipation, active segment 344 of PCM 342 can transform between crystalline and amorphous states, allowing PCM RF switch 230/330 to switch between electrically conductive ON and electrically insulative OFF states respectively. Thus, PCM RF switch 230/330 is configured to be electrically conductive when active segment 344 of PCM 342 is in a crystalline state, and to be electrically insulative when active segment 344 of PCM 342 is in an amorphous state.

PCM 342 can comprise germanium telluride ($Ge_xTe_y$), germanium antimony telluride ($Ge_xSb_yTe_z$), germanium selenide ($Ge_xSe_y$), or any other chalcogenide. In various implementations, PCM 342 can be germanium telluride having from forty percent to sixty percent germanium by composition (i.e., $Ge_xTe_y$, where $0.4 \leq X \leq 0.6$ and $Y=1-X$). The material for PCM 342 can be chosen based upon ON state resistivity, OFF state electric field breakdown voltage, crystallization temperature, melting temperature, or other considerations. It is noted that in FIG. 3, heating element 338 extends outwards and is transverse to PCM 342. Heating element 338 is illustrated with dashed lines as though seen through various structures of PCM RF switch 230/330. Current flowing in heating element 338 flows substantially under active segment 344 of PCM 342.

PCM contacts 232/332 of PCM RF switch 230/330 are connected to passive segments 346 of PCM 342, while heating element contacts 234/334 are connected to terminal segments of heating element 338. In various implementations, PCM contacts 232/332 and heating element contacts 234/334 can be formed of or include tungsten (W), copper (Cu), or aluminum (Al). In one implementation, PCM contacts 232/332 and heating element contacts 234/334 can each be formed of a single metal segment. In another implementation, PCM contacts 232/332 and heating element contacts 234/334 can each be formed using multiple metal segments. PCM contacts 232/332 are configured to route RF signals from/to an external connection to/from PCM 342. Analogously, heating element contacts 234/334 are configured to route electrical pulses from an external connection to heating element 338.

Figure 4:
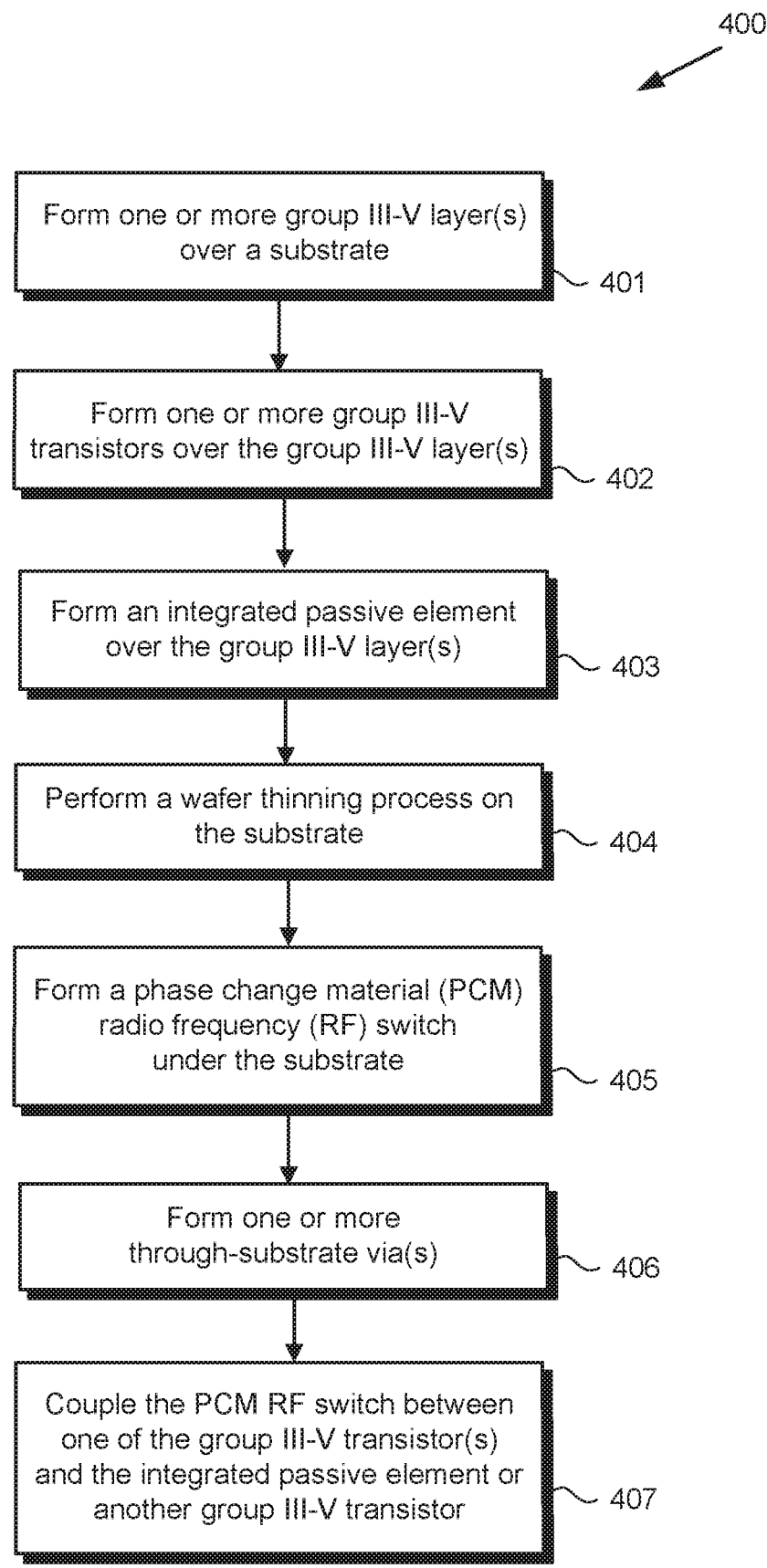
FIG. 4 shows a flowchart presenting an exemplary method for fabricating a semiconductor device including a PCM RF switch, according to yet another implementation.

Referring now to FIG. 4, FIG. 4 shows flowchart 400 presenting an exemplary method for fabricating a semiconductor device including a PCM RF switch, according to another implementation. It is noted that certain details and features have been left out of flowchart 400 that are apparent to a person of ordinary skill in the art, in order not to obscure the discussion of the inventive features in the present application.

Figure 5A:
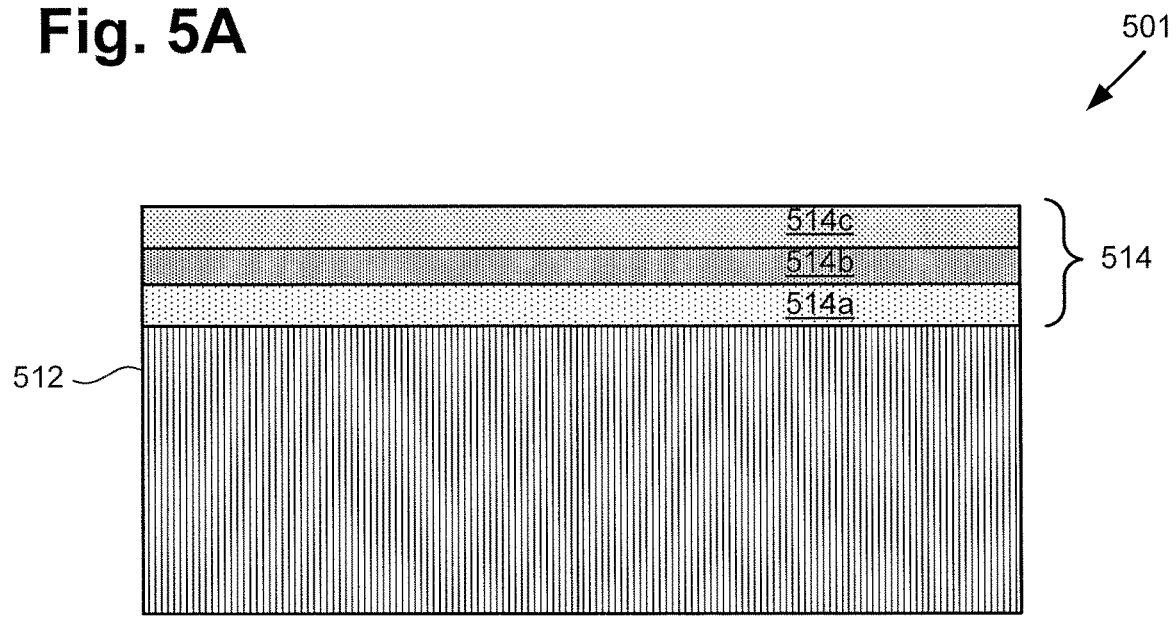
FIG. 5A shows a cross-sectional view of an exemplary structure corresponding to an initial fabrication stage according to the exemplary flowchart of FIG. 4.

Referring to FIG. 5A, FIG. 5A shows a cross-sectional view of exemplary structure 501 corresponding to an initial fabrication stage of the flowchart of FIG. 4. In particular, substrate 512 of structure 501 is selected so as to be suitable for use as a support substrate for one or more group III-V transistors, while group III-V layer or layers 514 (hereinafter "group III-V layer(s) 514") are selected to be suitable for fabricating the one or more group III-V transistors. Proceeding to FIGS. 5B, 5C, 5D, 5E, 5F, and 5G, those figures show the result of performing respective actions 402, 403, 404, 405, 406, and 407. That is to say, cross-sectional structure 502 shows the result of forming one or more group III-V transistors (518, 520) over one or more of group III-V layers 514 (action 502), and so forth.

It is noted that the cross-sectional structures shown in FIGS. 5A, 5B, 5C, 5D, 5E, 5F, and 5G (hereinafter "FIGS. 5A-5G") are provided as specific implementations of the present inventive principles, and are shown with such specificity for the purposes of conceptual clarity. It should also be understood that particular details such as the materials used to form the cross-sectional structures shown in FIGS. 5A-5G and the techniques used to produce the various depicted features, are being provided merely as examples, and should not be interpreted as limitations.

Referring to cross-sectional structure 501, in FIG. 5A, with further reference to FIG. 4, flowchart 400 begins with forming group III-V layer(s) 514 over substrate 512 (action 401). As noted above, substrate 512 may include any material suitable for use as a substrate for fabrication of one or more group III-V transistors. Examples of group III-V transistors for which substrate 512 may be utilized include group III-V heterostructure devices such as HFETs, group III-V HEMTs, and group III-V HBTs.

Substrate 512 may be a SiC substrate, or may be a native group III-V substrate, such as a GaAs, GaN, or InP substrate, for example. Moreover, although substrate 512 is shown as a substantially unitary substrate in FIG. 5A, in other implementations, substrate 512 may be a composite substrate, such as a single-crystal or polycrystalline SiC on silicon substrate, for example.

Group III-V layer(s) 514 may include any of a wide variety of group III-V materials. For example, one or more of group III-V layer(s) may include GaAs, AlGaAs, InGaAs, InP, InGaN, InGaP, GaN, GaP, AlN, and AlGaN. In implementations in which substrate 512 is a non-native substrate for fabrication of a group III-V transistor, group III-V layer(s) 514 may include layer 514a as a nucleation layer in the form of an AlN layer, for example. Moreover, in those implementations, layer 514b may correspond to multiple transition layers, in some implementations including a GaAs or GaN buffer layer, for example, situated between substrate 512 and a subsequently formed group III-V transistor. As a specific example, where substrate 512 is a SiC substrate, layer 514b may correspond to multiple distinguishable group III-V layers helping to mediate the lattice transition from substrate 512 to active layer or layers 514c for the overlying group III-V transistor or transistors (group III-V transistor(s) not shown in FIG. 5A).

Group III-V layer(s) 514 may be formed using any suitable technique known in the art. For example, in one implementation, group ITT-V layer(s) 514 may be formed using MOCVD. Moreover, in some implementations, group III-V layers 514 may be epitaxial layers formed using MBE or HVPE, to name two suitable techniques.

Figure 5B:
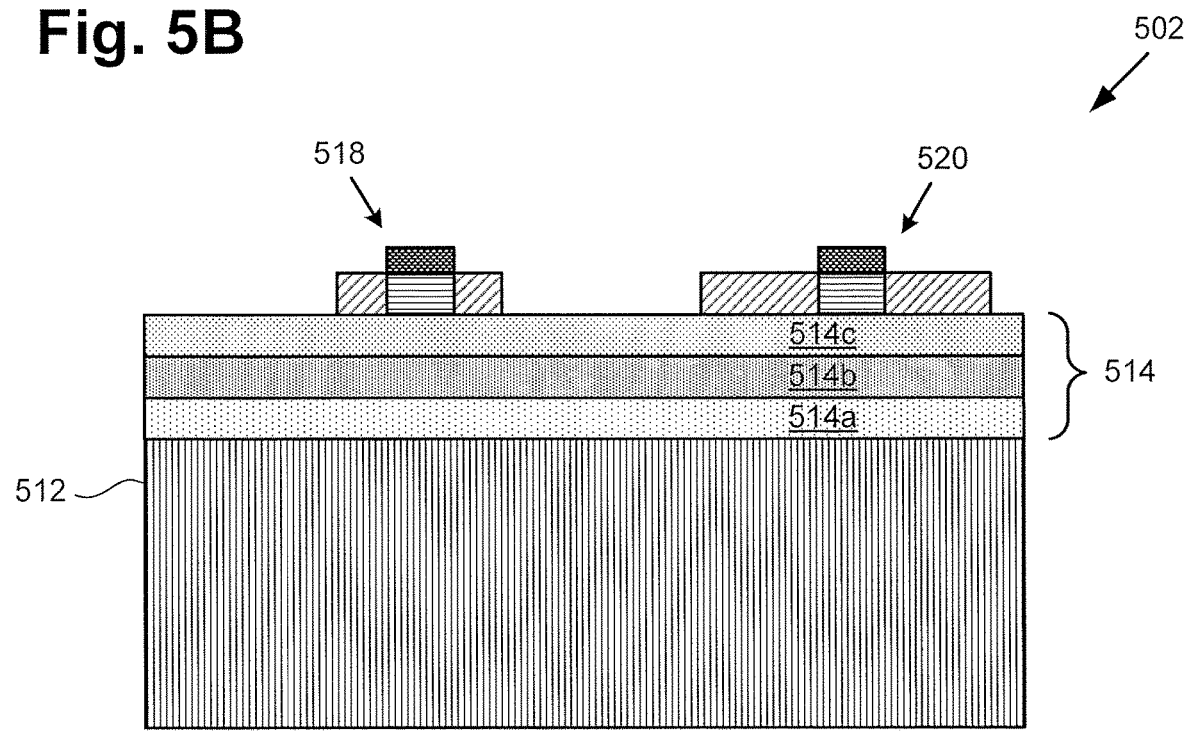
FIG. 5B shows a cross-sectional view of the exemplary structure of FIG. 5A at a subsequent fabrication stage according to the exemplary flowchart of FIG. 4.

Continuing to cross-sectional structure 502, in FIG. 5B, with further reference to FIG. 4, flowchart 400 continues with forming one or more group III-V transistors 518 and 520 over group III-V layer(s) 514 (action 402). Group III-V transistors 518 and 520 may be implemented as group III-V heterostructure devices such as HFETs, group III-V HEMTs, or group III-V HBTs. For example, one or both of group III-V transistors 518 and 520 may take the form of a GaAs or GaN based HEMT, or a GaAs based HBT.

Depending on the particular implementation of group III-V transistors 518 and 520, action 402 may include dopant implantation to form gate, source, and drain regions, or base, emitter, and collector regions, as well as formation of gate or base electrodes. Alternatively, in some implementations, formation of group III-V transistors 518 and 520 may include configuring a channel layer and barrier layer to produce a two-dimensional electron gas (2DEG) near their interface.

Figure 5C:
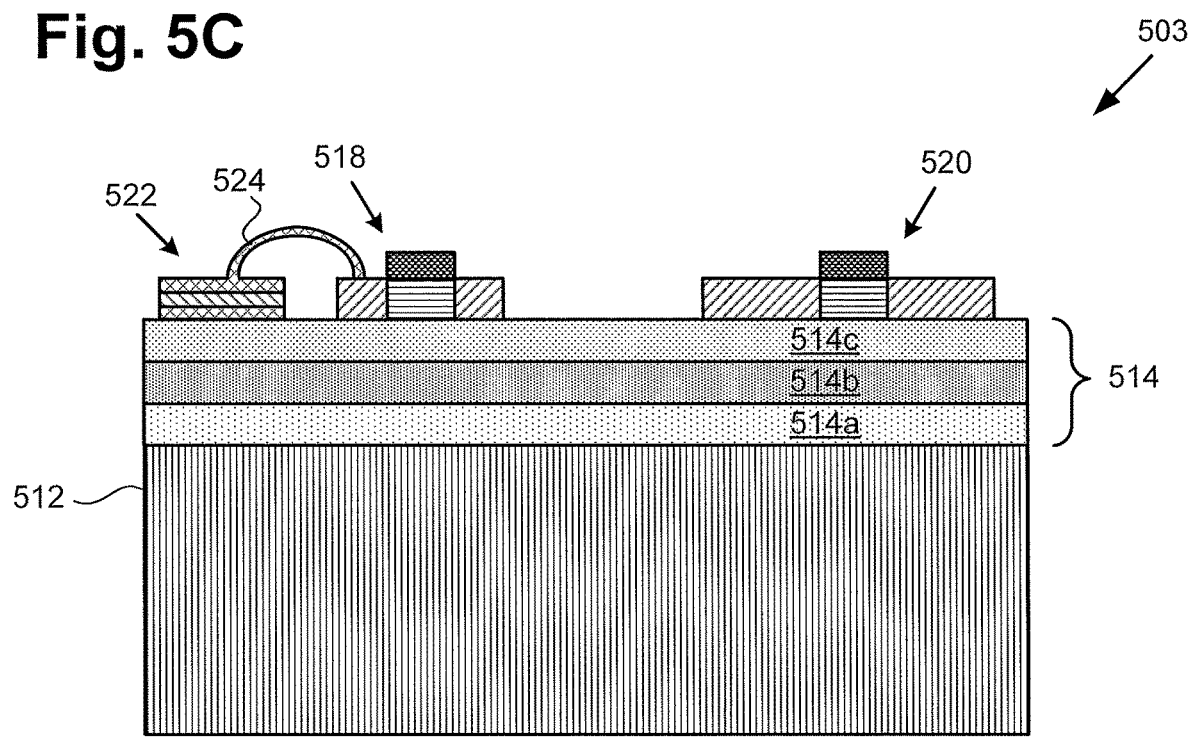
FIG. 5C shows a cross-sectional view of the exemplary structure of FIG. 5B at a subsequent fabrication stage according to the exemplary flowchart of FIG. 4.

Referring to cross-sectional structure 503, in FIG. 5C, flowchart 400 may continue with forming integrated passive element 522 over group III-V layer(s) 514 (action 403). It is noted that although integrated passive element 522 is depicted as a capacitor in the present figures, that implementation is merely exemplary. In other implementations, integrated passive element 522 may correspond to any of a capacitor, a resistor, an inductor, or a transmission line.

As shown in FIG. 5C, in some implementations, formation of integrated passive element 522 includes formation of front side metallization contact 524. Front side metallization contact 524 may be formed of gold (Au), for example, as the result of plating or through evaporative deposition. According to the exemplary implementation shown in FIG. 5C, front side metallization contact 524 electrically couples integrated passive element 522 to group III-V transistor 518.

Figure 5D:
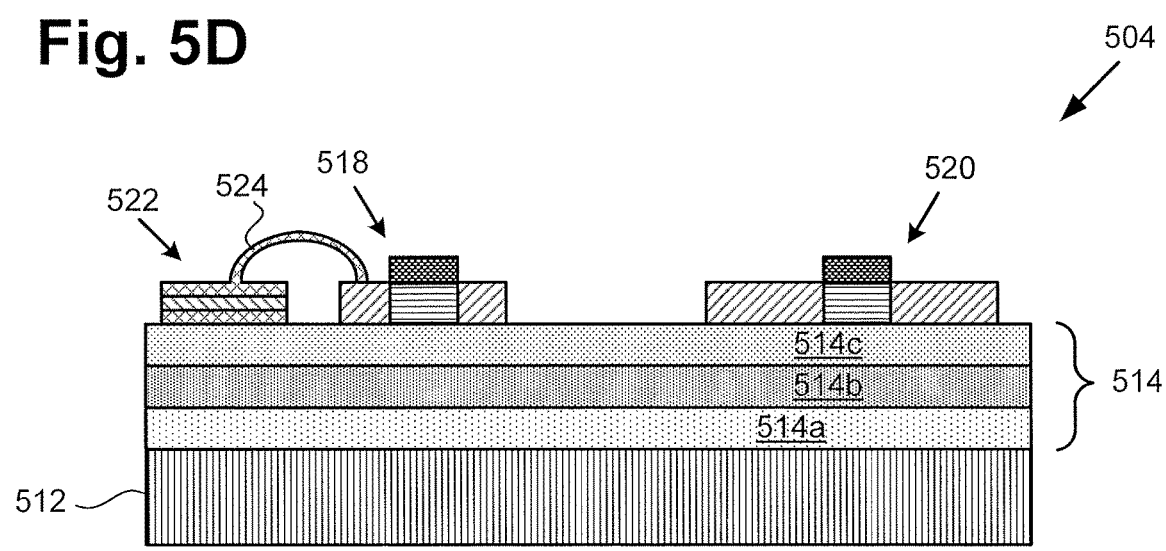
FIG. 5D shows a cross-sectional view of the exemplary structure of FIG. 5C at a subsequent fabrication stage according to the exemplary flowchart of FIG. 4.

Continuing to cross-sectional structure 504, in FIG. 5D, in one implementation, flowchart 400 may further include performing a wafer thinning process on substrate 512 (action 404). Thinning of substrate 512 may be performed using any suitable technique known in the art. For example, in one implementation, wafer thinning of substrate 512 may be performed through backgrinding of substrate 512.

Flowchart 400 continues with forming PCM RF switch 530 under substrate 512 (action 405). As shown by cross-sectional structure 505 in FIG. 5E, PCM RF switch 530 may include PCM contacts 532 and heating element contacts 534 transverse to PCM contacts 532. PCM RF switch 530, PCM contacts 532, and heating element contacts 534 correspond respectively in general to PCM RF switch 330, PCM contacts 332, and heating element contacts 334 in FIG. 3. That is to say, PCM RF switch 530, PCM contacts 532, and heating element contacts 534 may share any of the characteristics attributed to respective PCM RF switch 330, PCM contacts 332, and heating element contacts 334, by the present disclosure, and vice versa.

Figure 5E:
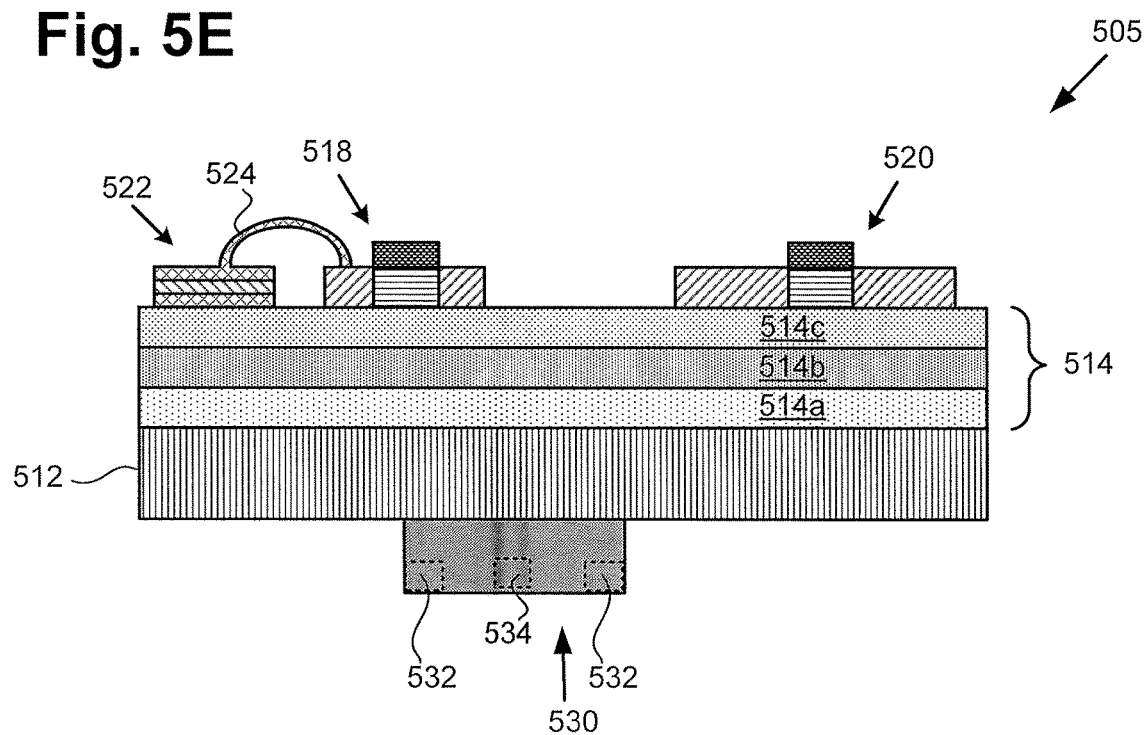
FIG. 5E shows a cross-sectional view of the exemplary structure of FIG. 5D at a subsequent fabrication stage according to the exemplary flowchart of FIG. 4.

Thus, although not shown in FIG. 5E, PCM RF switch 530 may include any or all of the features shown in FIG. 3 and described above. Accordingly, formation of PCM RF switch 530 may include formation of lower dielectric 336, thermally conductive and electrically insulating material 340, heating element 338, PCM 342, PCM contacts 332/532, heating element contacts 334/534, and, in some implementations, optional integrated heat spreader 348. Moreover, like PCM RF switch 330, PCM RF switch 530 is also configured to be electrically conductive when active segment 344 of PCM 342 is in a crystalline state, and to be electrically insulative when active segment 344 of PCM 342 is in an amorphous state.

It is noted that although flowchart 400 describes group III-V layer(s) 514 being formed over substrate 512, group III-V transistors 518 and 520 being formed over group III-V layer(s) 514, integrated passive element 522 and front side metallization contact 524 being formed over group III-V layer(s) 514, and thinning of substrate 512, in some implementations, actions 401, 402, 403, and 404 may be performed ex situ. In those cases, for example, some implementations of the method of flowchart 400 may begin with action 405, rather than action 401.

It is further noted that in implementations in which PCM RF switch 330/530 includes integrated heat spreader 348, lower dielectric 336 in PCM RF switch 330/530 may be situated over and interface integrated heat spreader 348. However, in some implementations, PCM RF switch 330/530 may omit integrated heat spreader 348, and may be configured to utilize substrate 512 as a heat spreader. That is to say, in some implementations, PCM RF switch 330/530 may interface substrate 512 and use substrate 512 as a heat spreader, in which case it may be advantageous or desirable for substrate 512 to be formed of a relatively good thermal conductor such as GaN or SiC, for example.

It is also noted that, in some implementations, a thermally conductive group III-V later may be interposed between substrate 512 and PCM RF switch 330/530, such as an AlN, AlGaN, or InGaN layer for example. In those implementations, PCM RF switch 330/530 may interface one of those AlN, AlGaN, and InGaN layers, rather than substrate 512, and use that AlN, AlGaN, or InGaN layer as a heat spreader.

Figure 5F:
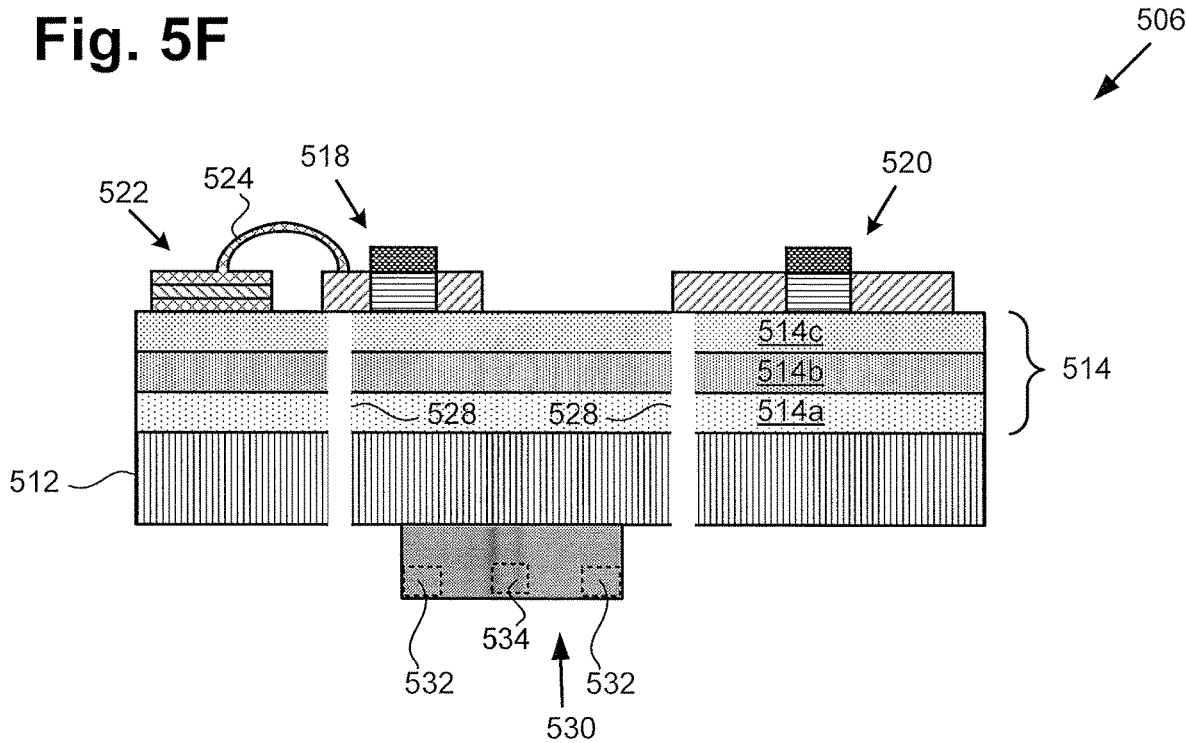
FIG. 5F shows a cross-sectional view of the exemplary structure of FIG. 5E at a subsequent fabrication stage according to the exemplary flowchart of FIG. 4.
Figure 5G:
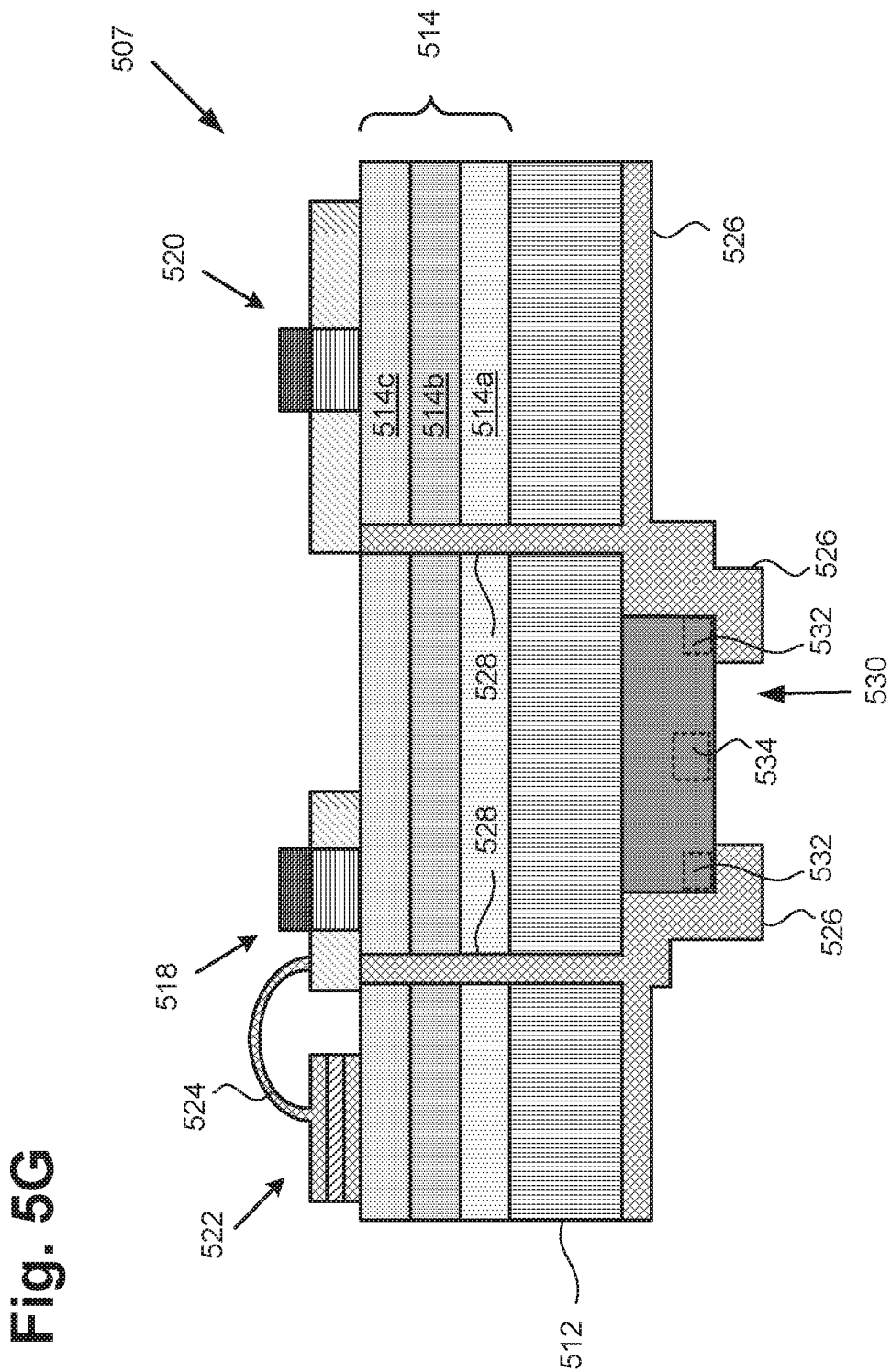
FIG. 5G shows a cross-sectional view of an exemplary semiconductor device including a PCM RF switch, according to another implementation.

Referring to cross-sectional structure 506, in FIG. 5F, flowchart 400 may continue with forming one or more TSVs 528 (action 406). As shown in FIG. 5F, TSVs 528 may extend through substrate 512, as well as through one or more of group III-V layer(s) 514. TSVs 528 may be formed using conventional semiconductor fabrication techniques, such as photolithography, and plasma or chemical etching.

Flowchart 400 can conclude with coupling PCM RF switch 530 between one of group III-V transistors 518 and 520 and either integrated passive element 522 or the other of group III-V transistors 518 and 520 (action 407). As shown by cross-sectional structure 507, in FIG. 5G, according to one implementation, PCM RF switch 530 can be coupled between group III-V transistor 518 and group III-V transistor 520 through TSVs 528 and front side metallization contact 524. As further shown in FIG. 5G, PCM RF switch 530 can be coupled between integrated passive element 522 and group III-V transistor 520 through front side metallization contact 524 and TSVs 528.

Coupling of PCM RF switch 530 between group III-V transistor 518 and group III-V transistor 520 may include lining or filling TSVs 528 with a conductive material and forming backside metallization 526 on the backside of thinned substrate 512. In one implementation, TSVs 528 may be lined or filled using the same conductive material used to form backside metallization 526. For example, TSVs 528 may be lined or filled using gold (Au), while backside metallization may also be formed of gold, as the result of plating or through evaporative deposition. Thus, according to the present exemplary implementations, PCM RF switch 530 is coupled between group III-V transistor 518 and group III-V transistor 520 using TSVs 528 and front side metallization contact 524.

As discussed above by reference to FIG. 3, PCM RF switch 530 may be made selectively conductive or selectively insulative according to the phase state of active PCM segment 344. Consequently, coupling PCM RF switch 530 between group III-V transistor 518 and group III-V transistor 520 advantageously provides a non-volatile, low-loss, switching solution for selectively making or breaking an electrical connection between group III-V transistor 518 and group III-V transistor 520.

Thus, the present application discloses semiconductor devices including a PCM RF switch, and methods for fabricating those semiconductor devices. By integrating a PCM RF switch with a group III-V semiconductor structure on which one or more group III-V transistors are fabricated, the present application enables the use of a PCM RF switch to electrically connect and disconnect a group III-V transistor from other device components. Moreover, use of a PCM RF switch that is electrically conductive when an active segment of the PCM is in a crystalline state and electrically insulative when the active segment is in an amorphous state renders the semiconductor device with which the PCM RF switch is integrated reconfigurable. As a result, integrating a PCM RF switch with a group III-V transistor advantageously provides a non-volatile reconfigurable semiconductor device characterized by low RF power loss.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A method for using a substrate having a group III-V layer thereon, and a group III-V transistor formed over said group III-V layer, said method comprising:
    forming a phase-change material (PCM) radio frequency (RF) switch over said group III-V layer;
    coupling said PCM RF switch between said group III-V transistor and one of an integrated passive element situated over said group III-V layer or another group III-V transistor situated over said group III-V layer;
    said PCM RF switch including a heating element transverse to said PCM, said heating element underlying an active segment of said PCM;
    said PCM RF switch including a thermally conductive and electrically insulating material between said heating element and said PCM;
    said PCM RF switch being configured to be electrically conductive when said active segment of said PCM is in a crystalline state, and to be electrically insulative when said active segment of said PCM is in an amorphous state.

2. The method of claim 1, comprising forming said integrated passive element prior to forming said PCM RF switch.

3. The method of claim 1, comprising forming said integrated passive element after forming said PCM RF switch.

4. The method of claim 1, wherein said coupling said PCM RF switch between said group III-V transistor and said one of said integrated passive element situated over said group III-V layer or said another group III-V transistor situated over said group III-V layer is performed using through-substrate vias.

5. The method of claim 1, wherein said PCM is selected from the group consisting of germanium telluride, germanium antimony telluride, and any other chalcogenide.

6. The method of claim 1, wherein said heating element comprises at least one of tungsten (W), molybdenum (Mo), titanium (Ti), titanium tungsten (TiW), titanium nitride (TiN), tantalum (Ta), nickel chromium (NiCr), or nickel chromium silicon (NiCrSi).

7. The method of claim 1, wherein said group III-V layer comprises a group III-V material selected from gallium arsenide (GaAs), aluminum gallium arsenide (AlGaAs), indium gallium arsenide (InGaAs), indium phosphide (InP), indium gallium nitride (InGaN), indium gallium phosphide (InGaP), gallium nitride (GaN), gallium phosphide (GaP), aluminum nitride (AlN), and aluminum gallium nitride (AlGaN).

8. The method of claim 1, wherein said PCM RF switch interfaces a heat spreader comprising a thermally conductive material selected from the group consisting of aluminum nitride (AlN), gallium nitride (GaN), gallium phosphide (GaP), aluminum gallium nitride (AlGaN), and silicon carbide (SiC).

9. The method of claim 1, wherein said integrated passive element is selected from the group consisting of a capacitor, a resistor, an inductor, and a transmission line.

10. A method for using a substrate having a group III-V layer thereon, a group III-V transistor formed over said group III-V layer, and an integrated passive element formed over said group III-V layer, said method comprising:
    forming a phase-change material (PCM) radio frequency (RF) switch under said substrate;
    coupling said PCM RF switch between said group III-V transistor and one of said integrated passive element situated over said group III-V layer or another group III-V transistor situated over said group III-V layer;
    said PCM RF switch including a heating element transverse to said PCM, said heating element underlying an active segment of said PCM;
    said PCM RF switch being configured to be electrically conductive when said active segment of said PCM is in a crystalline state, and to be electrically insulative when said active segment of said PCM is in an amorphous state.

11. The method of claim 10, wherein said coupling said PCM RF switch between said group III-V transistor and said one of said integrated passive element situated over said group III-V layer or said another group III-V transistor situated over said group III-V layer is performed using through-substrate vias.

12. The method of claim 10, wherein said PCM is selected from the group consisting of germanium telluride, germanium antimony telluride, and any other chalcogenide, and wherein said heating element comprises at least one of tungsten (W), molybdenum (Mo), titanium (Ti), titanium tungsten (TiW), titanium nitride (TiN), tantalum (Ta), nickel chromium (NiCr), or nickel chromium silicon (NiCrSi).

13. The method of claim 10, wherein said group III-V layer comprises a group III-V material selected from gallium arsenide (GaAs), aluminum gallium arsenide (AlGaAs), indium gallium arsenide (InGaAs), indium phosphide (InP), indium gallium nitride (InGaN), indium gallium phosphide (InGaP), gallium nitride (GaN), gallium phosphide (GaP), aluminum nitride (AlN), and aluminum gallium nitride (AlGaN).

14. The method of claim 10, wherein said PCM RF switch interfaces a heat spreader comprising a thermally conductive material selected from the group consisting of aluminum nitride (AlN), gallium nitride (GaN), aluminum gallium nitride (AlGaN), indium gallium nitride (InGaN), and silicon carbide (SiC).

15. A semiconductor device comprising:
a group III-V layer situated over a substrate;
a phase-change material (PCM) radio frequency (RF) switch situated over said group III-V layer;
said PCM RF switch coupling a group III-V transistor situated over said group III-V layer to one of an integrated passive element situated over said group III-V layer or another group III-V transistor situated over said group III-V layer;
said PCM RF switch including a heating element transverse to said PCM, said heating element underlying an active segment of said PCM;
said PCM RF switch including a thermally conductive and electrically insulating material between said heating element and said PCM;
said PCM RF switch being configured to be electrically conductive when said active segment of said PCM is in a crystalline state, and to be electrically insulative when said active segment of said PCM is in an amorphous state.

16. The semiconductor device of claim 15, further comprising through-substrate vias for coupling said PCM RF switch with said group III-V transistor and said one of said integrated passive element situated over said group III-V layer or said another group III-V transistor situated over said group III-V layer.

17. The semiconductor device of claim 15, wherein said PCM is selected from the group consisting of germanium telluride, germanium antimony telluride, and any other chalcogenide.

18. The semiconductor device of claim 15, wherein said heating element comprises at least one of tungsten (W), molybdenum (Mo), titanium (Ti), titanium tungsten (TiW), titanium nitride (TiN), tantalum (Ta), nickel chromium (NiCr), or nickel chromium silicon (NiCrSi).

19. The semiconductor device of claim 15, wherein said group III-V layer comprises a group III-V material selected from gallium arsenide (GaAs), aluminum gallium arsenide (AlGaAs), indium gallium arsenide (InGaAs), indium phosphide (InP), indium gallium nitride (InGaN), indium gallium phosphide (InGaP), gallium nitride (GaN), gallium phosphide (GaP), aluminum nitride (AlN), and aluminum gallium nitride (AlGaN).

20. The semiconductor device of claim 15, wherein said PCM RF switch interfaces a heat spreader comprising a thermally conductive material selected from the group consisting of aluminum nitride (AlN), gallium nitride (GaN), gallium phosphide (GaP), aluminum gallium nitride (AlGaN), and silicon carbide (SiC).

21. The semiconductor device of claim 15, wherein said integrated passive element is selected from the group consisting of a capacitor, a resistor, and inductor, and a transmission line.

22. A semiconductor device comprising:
a group III-V layer situated over a substrate;
a phase-change material (PCM) radio frequency (RF) switch situated under said substrate;
said PCM RF switch coupling a group I-V transistor situated over said group III-V layer to one of an integrated passive element situated over said group III-V layer or another group II-V transistor situated over said group III-V layer;
said PCM RF switch including a heating element transverse to said PCM, said heating element underlying an active segment of said PCM;
said PCM RF switch being configured to be electrically conductive when said active segment of said PCM is in a crystalline state, and to be electrically insulative when said active segment of said PCM is in an amorphous state.

23. The semiconductor device of claim 22, further comprising through-substrate vias for coupling said PCM RF switch with said group III-V transistor and said one of s integrated passive element situated over said group III-V layer or said another group III-V transistor situated over said group III-V layer.

24. The semiconductor device of claim 22, wherein said PCM is selected from the group consisting of germanium telluride, germanium antimony telluride, and any other chalcogenide, and wherein said heating element comprises at least one of tungsten (W), molybdenum (Mo), titanium (Ti), titanium tungsten (TiW), titanium nitride (TiN), tantalum (Ta), nickel chromium (NiCr), or nickel chromium silicon (NiCrSi).

25. The semiconductor device of claim 22, wherein said group III-V layer comprises a group III-V material selected from gallium arsenide (GaAs), aluminum gallium arsenide (AlGaAs), indium gallium arsenide (InGaAs), indium phosphide (InP), indium gallium nitride (InGaN), indium gallium phosphide (InGaP), gallium nitride (GaN), gallium phosphide (GaP), aluminum nitride (AlN), and aluminum gallium nitride (AlGaN).

26. The semiconductor device of claim 22, wherein said PCM RF switch interfaces a heat spreader comprising a thermally conductive material selected from the group consisting of aluminum nitride (AlN), gallium nitride (GaN), aluminum gallium nitride (AlGaN), indium gallium nitride (InGaN), and silicon carbide (SiC).

* * * * *

UNITED STATES PATENT AND TRADEMARK OFFICE
CERTIFICATE OF CORRECTION

PATENT NO. : 10,916,540 B2  
APPLICATION NO. : 16/173340  
DATED : February 9, 2021  
INVENTOR(S) : El-Hinnawy et al.

Page 1 of 1

It is certified that error appears in the above-identified patent and that said Letters Patent is hereby corrected as shown below:

In the Claims

Column 16, Line 17, "said PCM RF switch coupling a group I-V transistor" should be --said PCM RF switch coupling a group III-V transistor--

Column 16, Line 20, "III-V layer or another group II-V transistor situated" should be --III-V layer or another group III-V transistor situated--

Column 16, Line 32, "switch with said group III-V transistor and said one of s" should be --switch with said group III-V transistor and said one of said--

Signed and Sealed this  
Sixth Day of April, 2021

Drew Hirshfeld  
*Performing the Functions and Duties of the  
Under Secretary of Commerce for Intellectual Property and  
Director of the United States Patent and Trademark Office*